United States Patent
Chen

(10) Patent No.: US 7,566,895 B2
(45) Date of Patent: Jul. 28, 2009

(54) PHASE CHANGE MEMORY DEVICE AND METHOD FOR FABRICATING THE SAME

(75) Inventor: Wei-Su Chen, Hsinchu (TW)

(73) Assignees: Industrial Technology Research Institute, Hsinchu (TW); Powerchip Semiconductor Corp., Hsin-Chu (TW); Nanya Technology Corporation, Taoyuan (TW); ProMOS Technologies Inc., Hsinchu (TW); Winbond Electronics Corp., Hsinchu (TW)

( * ) Notice: Subject to any disclaimer, the term of this patent is extended or adjusted under 35 U.S.C. 154(b) by 123 days.

(21) Appl. No.: 11/753,528

(22) Filed: May 24, 2007

(65) Prior Publication Data
US 2008/0121863 A1    May 29, 2008

(30) Foreign Application Priority Data
Nov. 24, 2006   (TW) .............................. 95143546 A

(51) Int. Cl.
*H01L 29/02* (2006.01)
(52) U.S. Cl. .................. 257/2; 257/3; 257/4; 257/5; 257/E45.002; 438/102; 438/103
(58) Field of Classification Search ................ 257/1–5, 257/E45.002; 438/102–103
See application file for complete search history.

(56) References Cited

U.S. PATENT DOCUMENTS

| 6,501,111 | B1 | 12/2002 | Lowrey | |
| 2006/0131618 | A1* | 6/2006 | Hsueh | ........................ 257/246 |

FOREIGN PATENT DOCUMENTS

EP    1339111 A1    8/2003

* cited by examiner

*Primary Examiner*—Thanh V Pham
*Assistant Examiner*—Jami M Valentine
(74) *Attorney, Agent, or Firm*—Quintero Law Office

(57) ABSTRACT

A phase change memory device is provided. The phase change memory device includes a substrate comprising a stacked structure. The stacked structure comprises a plurality of insulating layers and conductive layers. Any two of the conductive layers are spaced apart by one of the conductive layers. A first electrode structure with a first sidewall and a second sidewall is formed on the stacked structure. A plurality of heating electrodes is placed on the conductive layers and adjacent to the first sidewall and the second sidewall of the first electrode structure. A pair of phase change material spacers is placed on the first sidewall and the second sidewall of the first electrode structure. The phase change material sidewalls cover the plurality of heating electrodes.

17 Claims, 28 Drawing Sheets

PHASE CHANGE MEMORY DEVICE AND METHOD FOR FABRICATING THE SAME

BACKGROUND OF THE INVENTION

1. Field of the Invention

The invention relates to a phase change memory device and method for fabricating the same, and more particularly to a phase change memory device with relatively higher device density and a method for fabricating the same.

2. Description of the Related Art

A phase change memory (PCM) device may potentially serve as a 64-megabyte (MB) or greater stand-alone non-volatile memory. Before PCM devices become a mainstream replacement for flash memory, however, excellent electrical and thermal performance of PCM devices must be attained. Fabrication of non-volatile memory with relatively higher device density using the conventional fabricating process is, however, a major aim of researchers.

U.S. Pat. No. 6,501,111 issued by Intel Corporation discloses a conventional three-dimensional PCM (3D-PCM) 212 with a cup-shaped bottom electrode 206 as shown in FIG. 1a. A contact area between a phase change material 207 and a bottom electrode can serve as a contact area between the phase change material 207 and a width of the cup-shaped bottom electrode 206, thus, device density can be improved. In conventional PCM fabrication, however, a bottleneck occurs when minimizing the device area and is not suitable for photolithography process with a critical dimension (CD) below 0.1 μm. EP Pat. No. 1339111 issued by ST Microelectronics (STM) Corporation discloses a PCM formed by filling a phase change material into a contact hole 57 with a nano-level CD or a minitrench 58 to reduce the contact area 58 between the phase change material and a cup-shaped heating electrode 22, thus, higher device density can be achieved. If the CD of the contact hole is too small to be filled with phase change material, however, a seam problem occurs.

A PCM device with a higher device density and not limited by the photolithography resolution is desirable.

BRIEF SUMMARY OF INVENTION

A detailed description is given in the following embodiments with reference to the accompanying drawings.

The invention provides a phase change memory device and method for fabricating the same. An exemplary embodiment of a phase change memory device comprises a substrate comprising a stacked structure. The stacked structure comprises a plurality of insulating layers and conductive layers. Any two of the adjacent conductive layers of the stacked structure are spaced apart by one of the insulating layers. A first electrode structure comprising a first sidewall and a second sidewall is formed on the stacked structure. A plurality of heating electrodes is placed on the conductive layers and the adjoining first sidewall and the second sidewall of the first electrode structure. A pair of phase change material spacers is placed on the first sidewall and the second sidewall of the first electrode structure covering the plurality of heating electrodes.

A method of fabricating a phase change memory device comprises providing a substrate comprising a stacked structure. The stacked structure comprises a plurality of insulating layers and conductive layers. Any two of the adjacent conductive layers are spaced apart by one of the conductive layers. A first electrode structure with a first sidewall and a second sidewall is formed on the stacked structure. A plurality of heating electrodes is formed on the conductive layers and the adjoining first sidewall and the second sidewall of the first electrode structure. A pair of phase change material spacers is formed and placed on the first sidewall and the second sidewall of the first electrode structure covering the plurality of heating electrodes.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
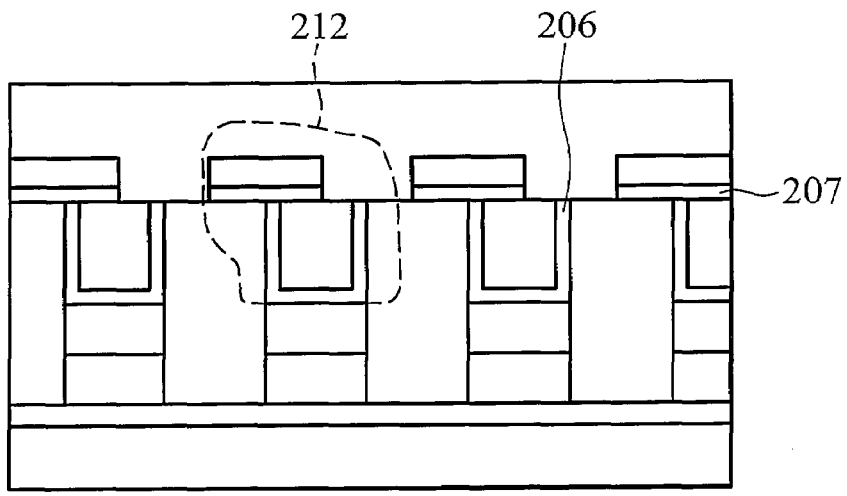
FIGS. 1a and 1b show conventional phase change memory devices.
Figure 1B:
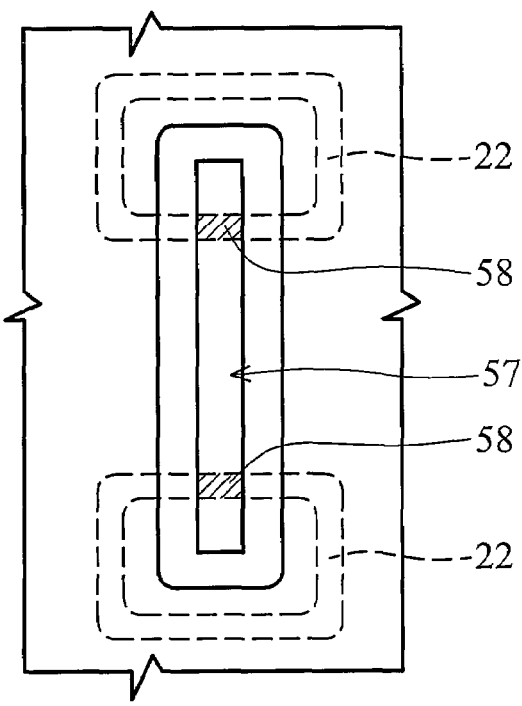

The following description is of the best-contemplated mode of carrying out the invention. This description is made for the purpose of illustrating the general principles of the invention and should not be taken in a limiting sense. The scope of the invention is best determined by reference to the appended claims.

FIGS. 2a, 3a, 4a, 5a, 6a, 7a, 8a, 9a, 10a, 11a and 12a show top views of an exemplary embodiment of a phase change memory device. For convenience, top views of two phase change memory devices are shown. FIGS. 2b, 3b, 4b, 5b, 6b, 7b and 10b are cross sections taken s along line A-A' of FIGS. 2a, 3a, 4a, 5a, 6a, 7a and 10a respectively. FIGS. 7c, 8b, 9b, 10c, 11b and 12b are cross sections taken along line B-B' of FIGS. 7a, 8a, 9a, 10a, 11a and 12a respectively. Wherever possible, the same reference numbers are used in the drawings and the descriptions to indicate the same or like parts.

Figure 2A:
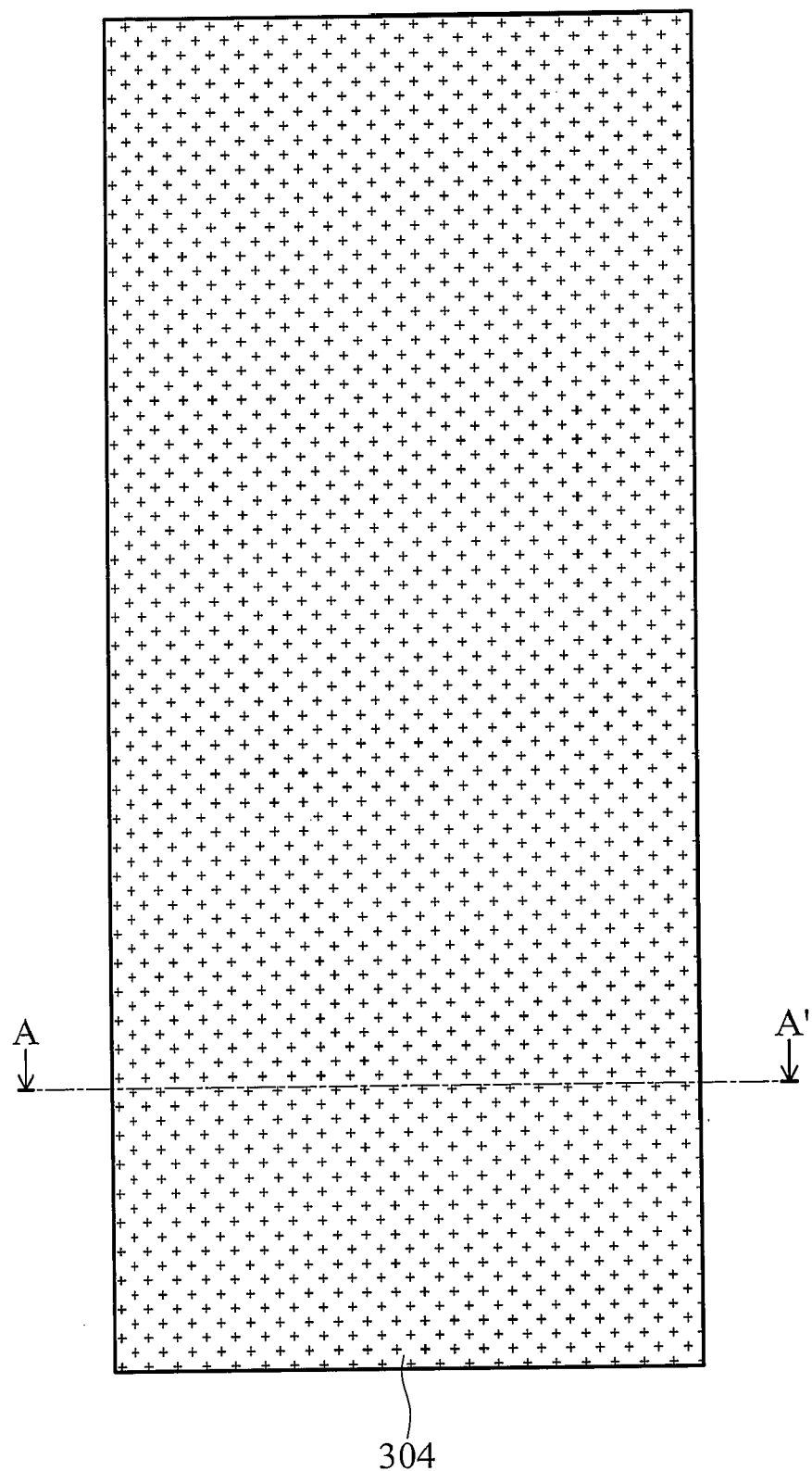
FIGS. 2a, 3a, 4a, 5a, 6a, 7a, 8a, 9a, 10a, 11a and 12a show top views of an exemplary embodiment of a phase change memory device.
Figure 2B:
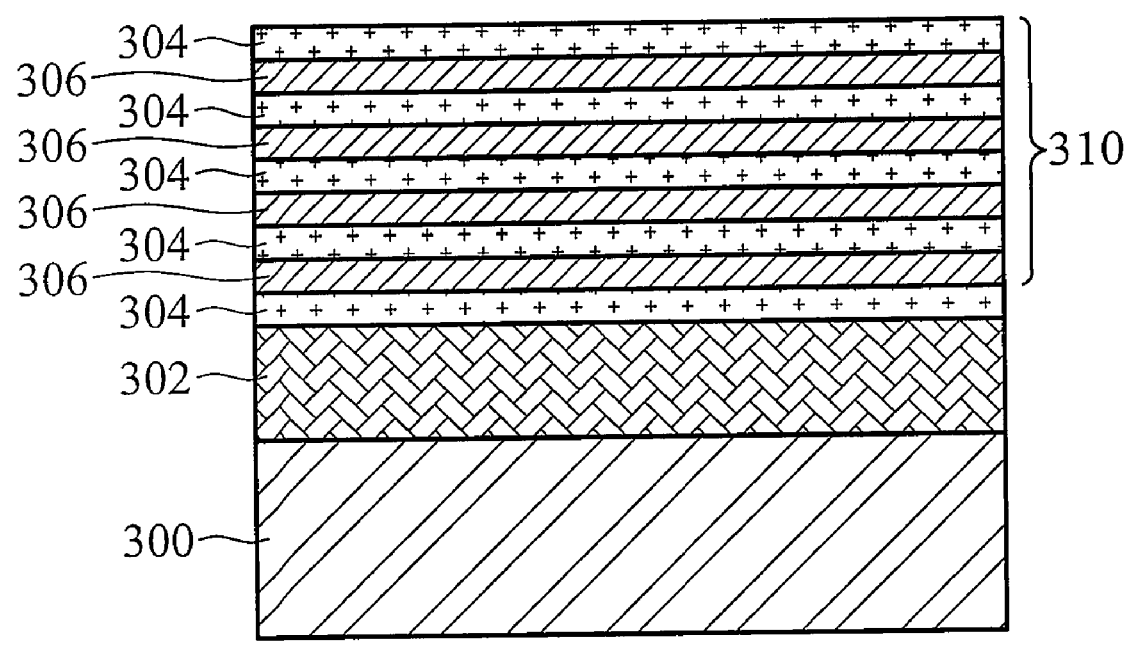
FIGS. 2b, 3b, 4b, 5b, 6b, 7b and 10b are cross sections taken along line A-A' of FIGS. 2a, 3a, 4a, 5a, 6a, 7a and 10a, respectively.

FIG. 2a illustrates a top view of an exemplary embodiment of a phase change memory device 100. FIG. 2b shows a cross section of the phase change memory device 100 taken substantially along line A-A' of FIG. 2a. A substrate 300 is provided. The substrate 310 may comprise silicon. In alternative embodiments, SiGe, bulk semiconductor, strained semiconductor, compound semiconductor, silicon on insulator (SOI), and other commonly used semiconductor substrates can be used for the substrate 300. Next, an insulating layer 302 such as silicon dioxide ($SiO_2$) is formed on the substrate 300 by, for example, thermal oxidation. The insulating layer 302 may also comprise silicon nitride ($SiN_x$). A plurality of insulating layers 304 and conductive layers 306 are alternatively formed on the insulating layer 302 to form a stacked structure 310 by chemical vapor deposition (CVD) or other known deposition process. In one embodiment, the insulating layer 304 and the conductive layer 306 respectively have more than one, preferably more than two, and more preferably more than four layers. The insulating layers 304 are about 10 nm to 300 nm thick, and are preferably about 20 nm thick. The conductive layers 306 are about 10 nm to 300 nm thick, and are preferably about 20 nm thick. Any two of the adjacent conductive layers 306 of the stacked structure 310 are spaced apart by one of the insulating layers 304, and a top layer of the stacked structure 310 is one of the insulating layers 304. The insulating layers 304 may comprise silicon dioxide (SiO$_2$), and the conductive layers 306 may comprise polysilicon, and preferably comprise p-type impurities doped polysilicon. The p-type impurities may comprise boron (B) or difluoroborane (BF$_2$). In another embodiment, the conductive layers 306 may comprise amorphous silicon. In alternative embodiments, the conductive layers 306 may comprise single crystal silicon formed by annealing polysilicon or amorphous silicon.

Figure 3A:
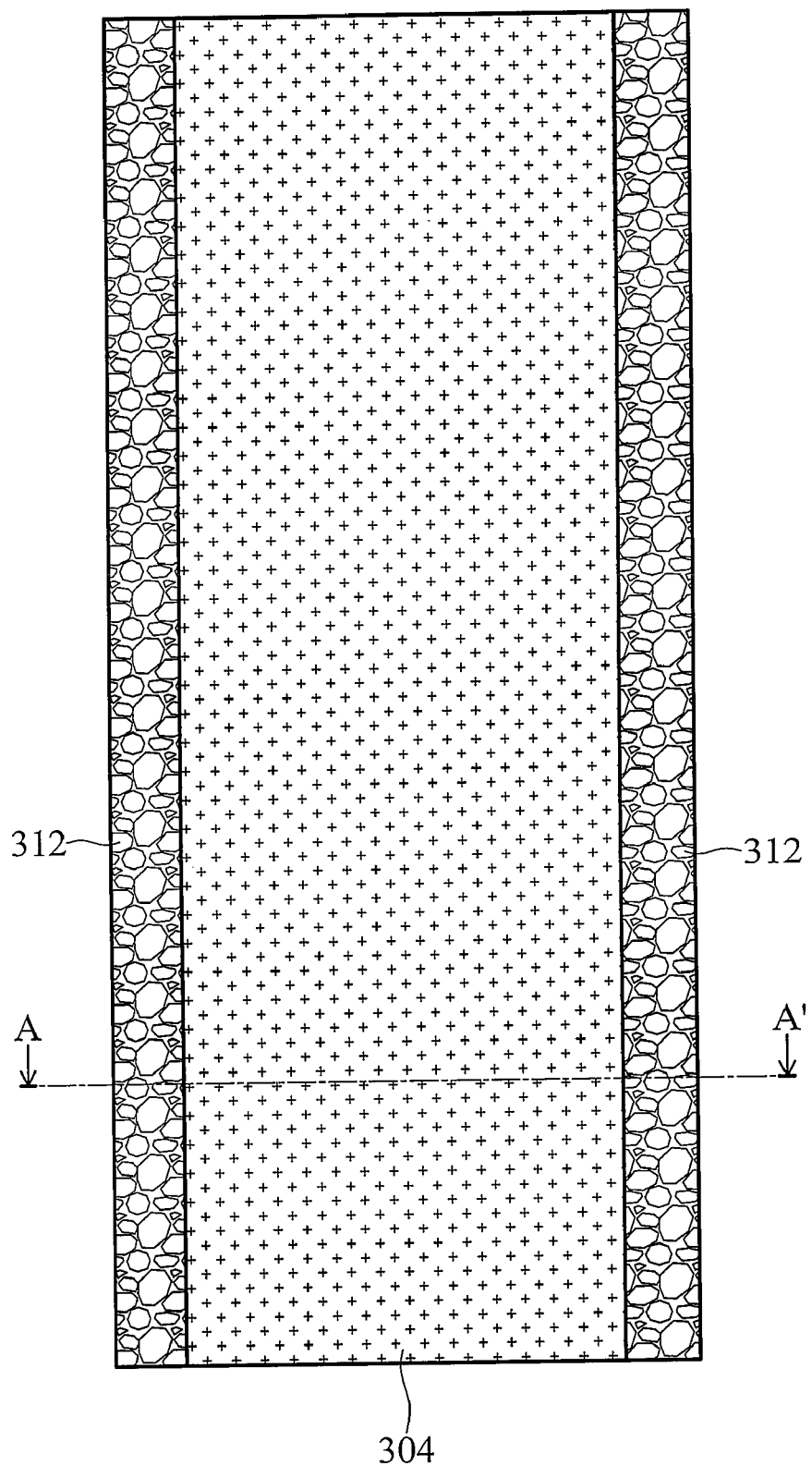
Figure 3B:
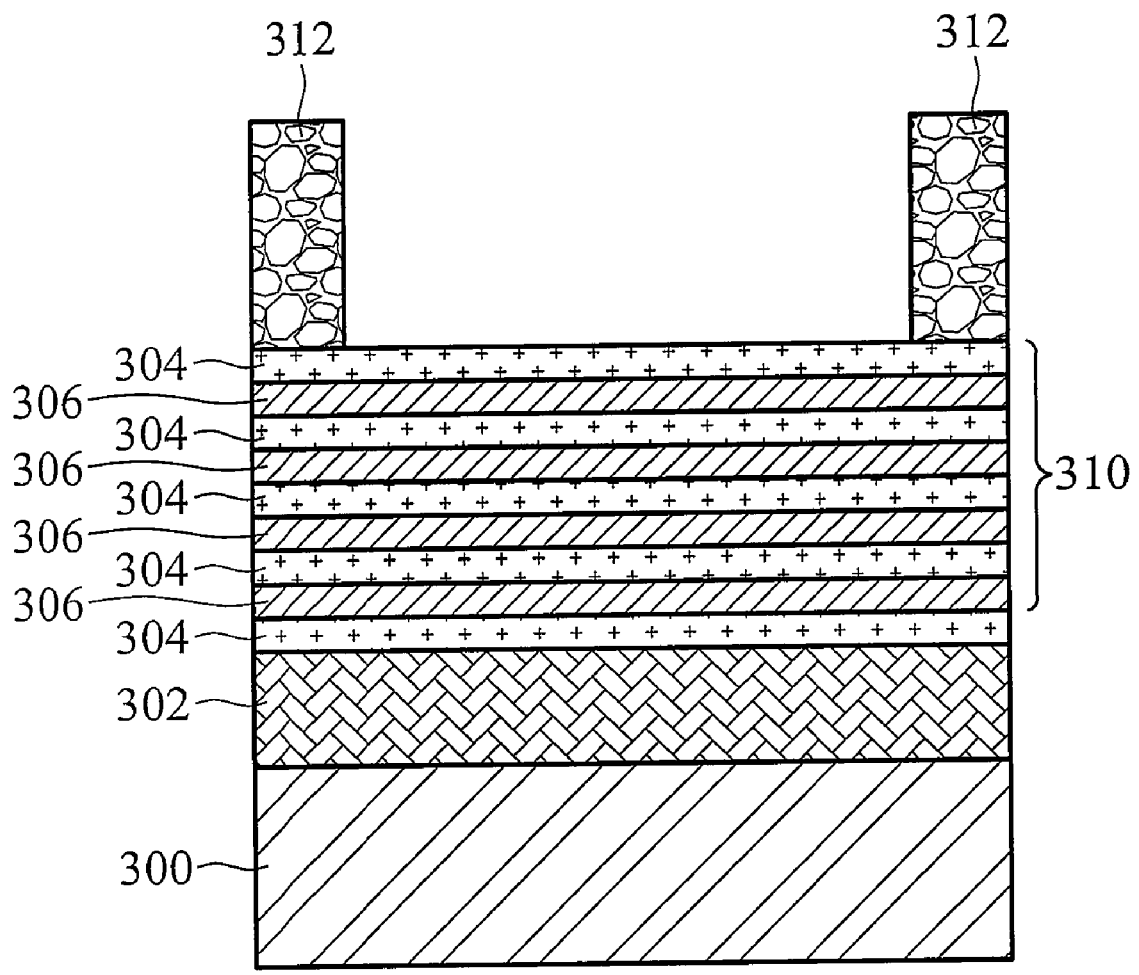
Figure 4A:
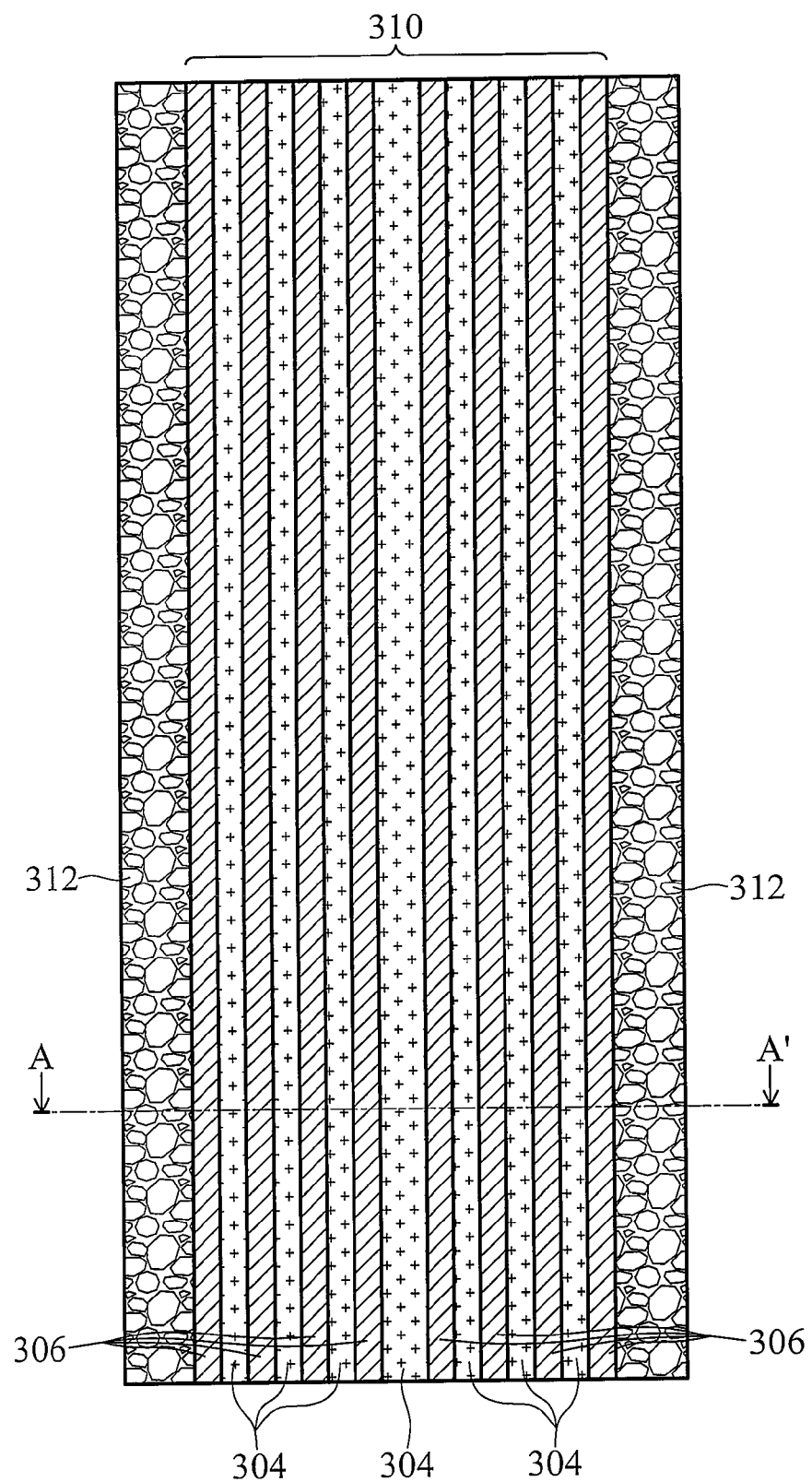
Figure 4B:
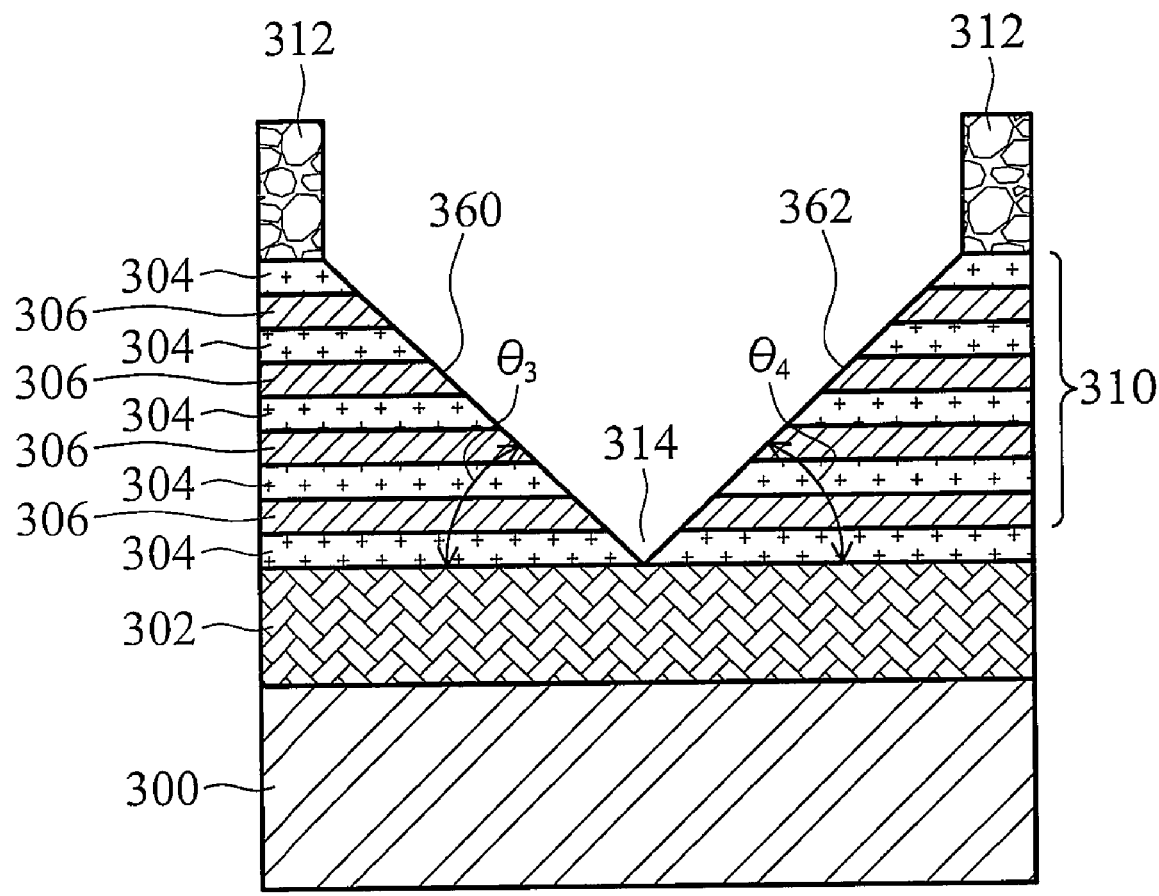

FIGS. 3a and 3b illustrate the formation of a patterned photoresist 312. Next, referring to FIGS. 4a and 4b, a V-shaped first trench 314 is formed in the stacked structure 310 by etching the insulating layer 304 and the conductive layer 306 of the stacked structure 310 until the insulating layer 302 is exposed using the patterned photoresist 312 as a mask. The V-shaped first trench 314 has a third sidewall 360 and a fourth sidewall 362 with an angle $\theta_3$ between the third sidewall 360 and the substrate 300 and an angle $\theta_4$ between the fourth sidewall 362 and the substrate 300. In one embodiment, the angles $\theta_3$ and $\theta_4$ are about 0° to 90°, preferably about 30° to 60°, more preferably about 40° to 50°. The angles $\theta_3$ and $\theta_4$ may be the same or different. The stacked structure 310 may be etched by non-vertical etching, under precisely controlled process conditions such as etching bias. Additionally, other methods may be utilized for forming V-shaped first trench 314. For example, the patterned photoresist 312 may be reflowed to form a photoresist having a micro-lens shape by a photoresist thermal reflowing process, thus, any two of the adjacent patterned photoresists 312 become substantially V-shaped. An anisotropic etching process is then performed to form the V-shaped first trench 314.

Figure 5A:
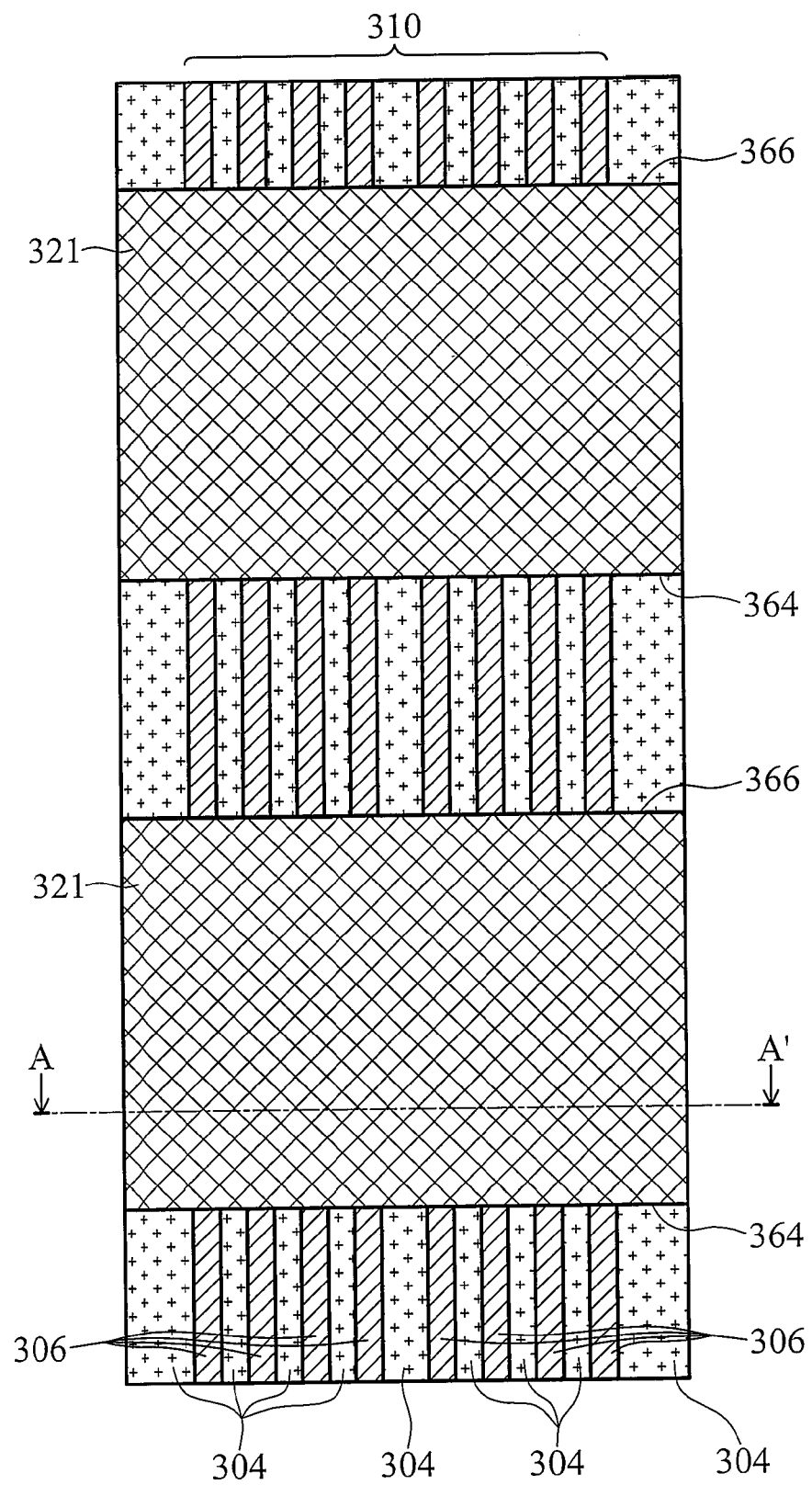
Figure 5B:
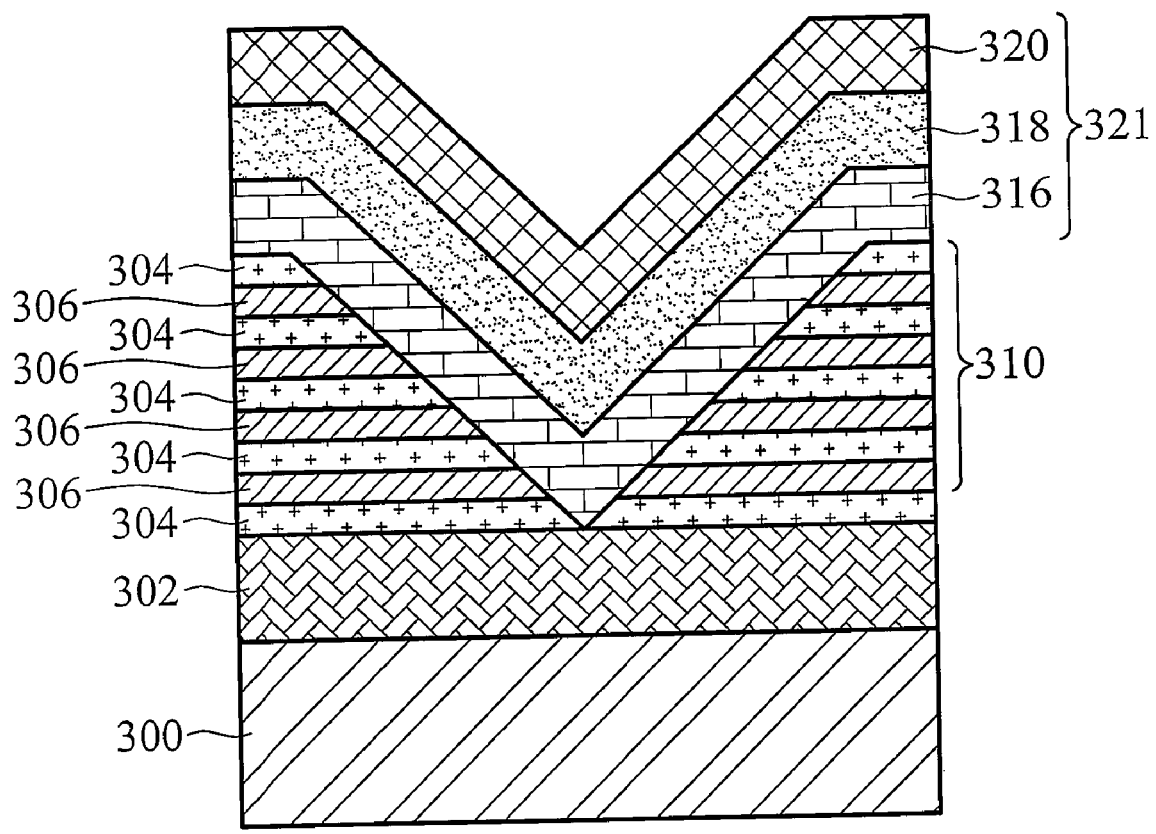

FIGS. 5a and 5b illustrate the formation of a first semi-electrode structure 321. An insulating layer 316, a conductive layer 318 and a silicon nitride layer 320 are formed on the stacked structure 310 in sequence and filled into the first trench 314 by CVD or other known deposition processes. Next, a patterned photoresist (not shown) covers a forming position of the first trench 314. An anisotropic etching process is performed to remove the insulating layer 316, the conductive layer 318 and the silicon nitride layer 320 not covered by the patterned photoresist. The patterned photoresist is then removed to form the first semi-electrode structure 321. The first semi-electrode structure 321 has a first sidewall 364 and a second sidewall 366. The insulating layer 316 of the first semi-electrode structure 321 may comprise silicon dioxide (SiO$_2$). The conductive layer 318 may comprise polysilicon, preferably polysilicon doped with n-type impurities. The n-type impurities may comprise phosphorous (P) or arsenic (As). The conductive layer 318 may alternatively comprise amorphous silicon.

Figure 6A:
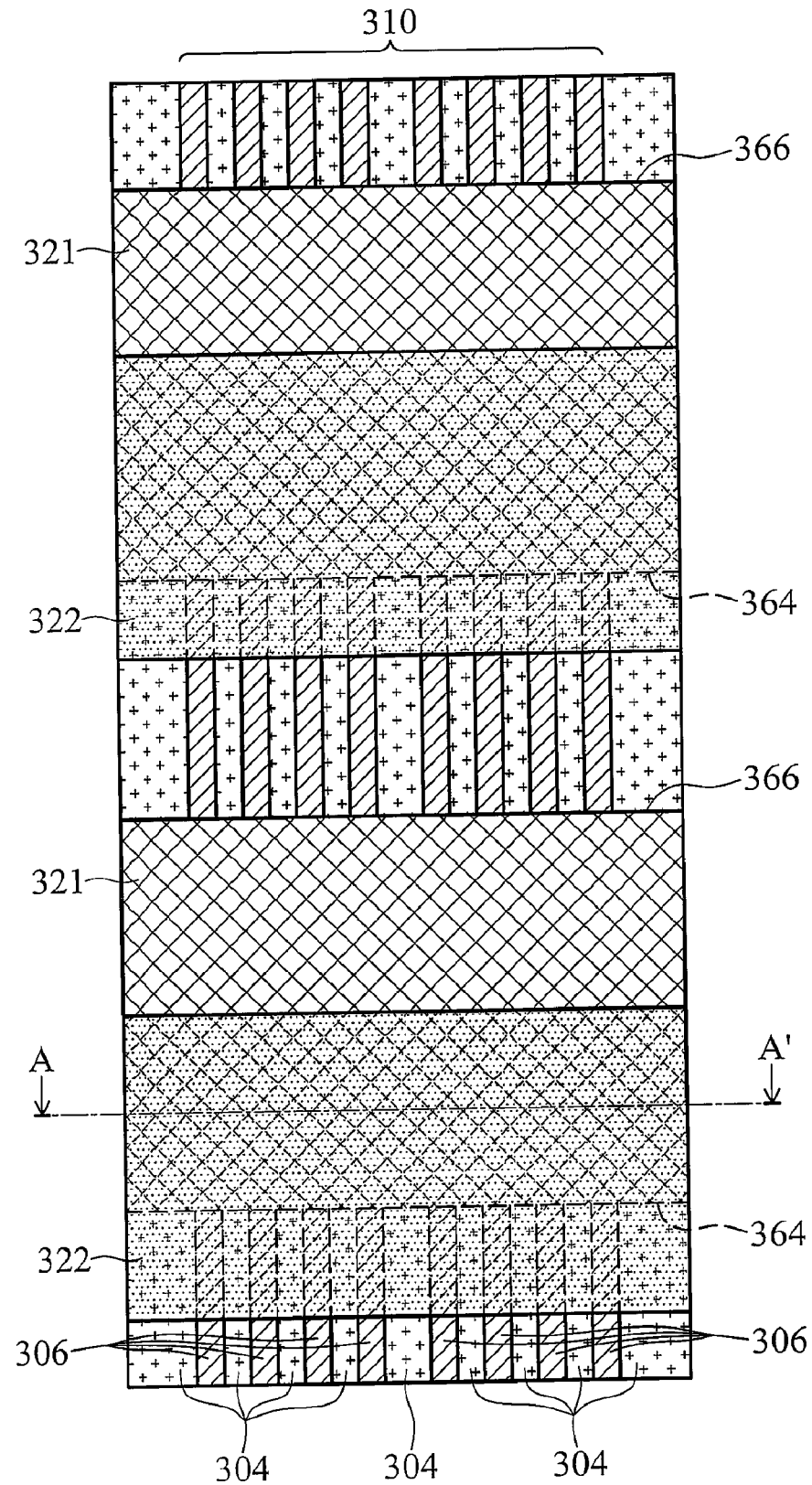
Figure 6B:
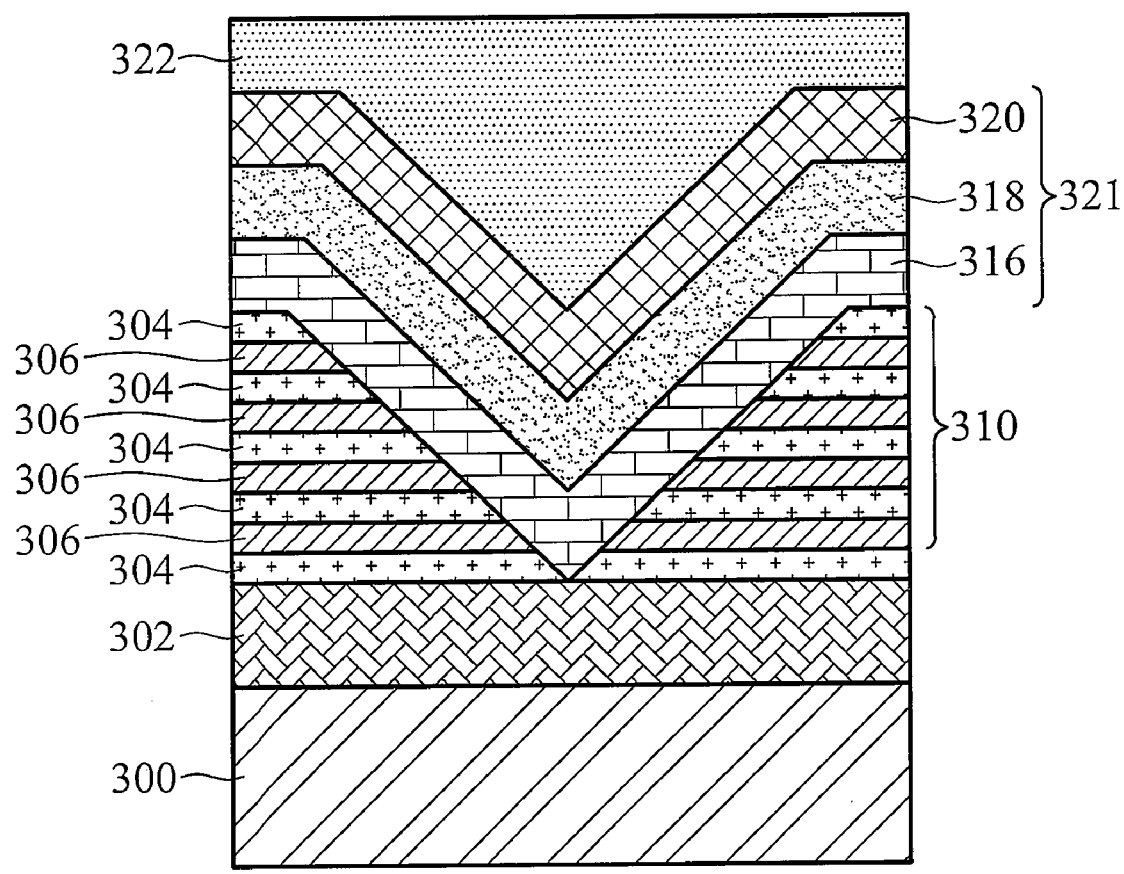
Figure 7A:
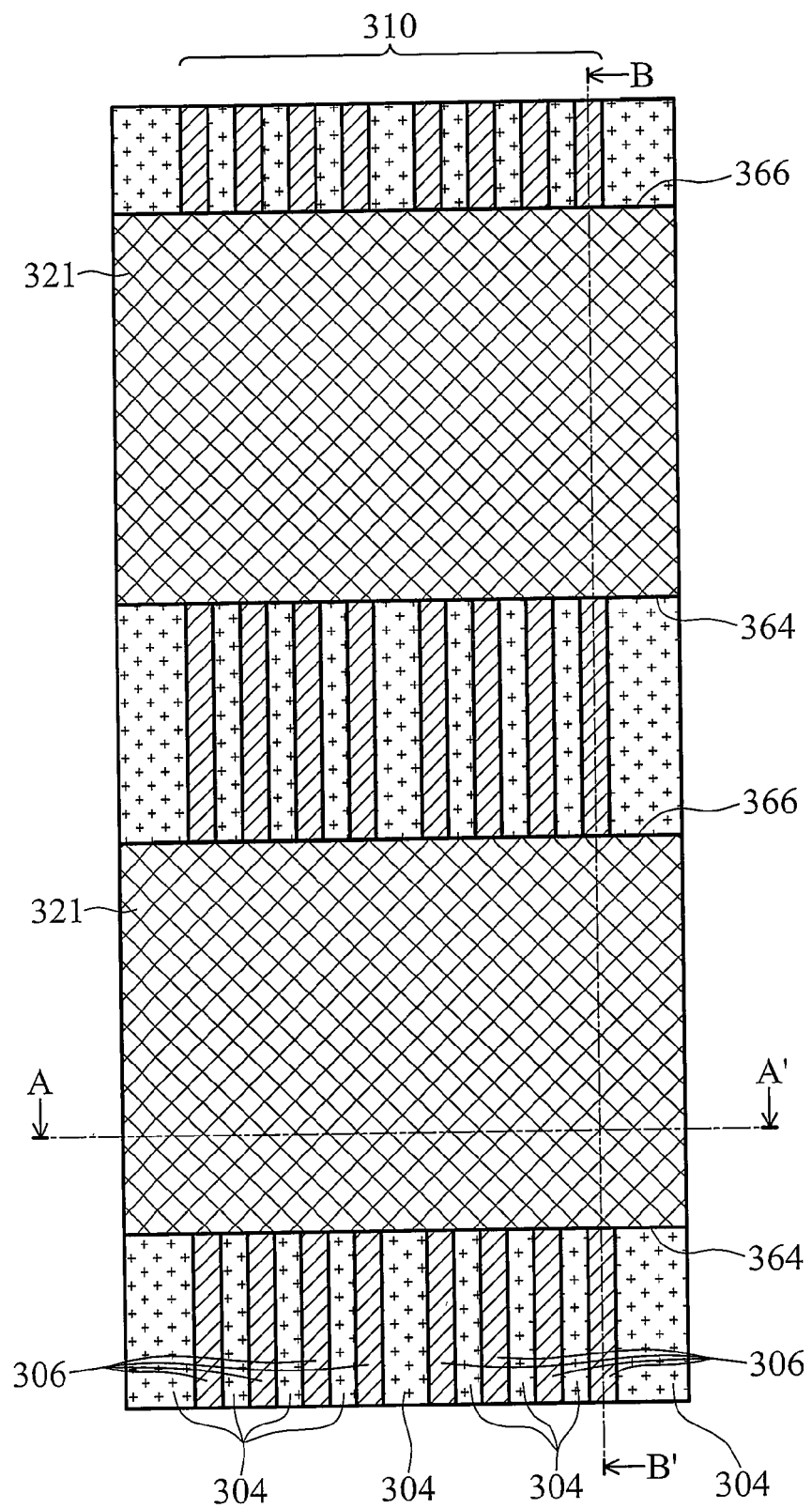
Figure 7B:
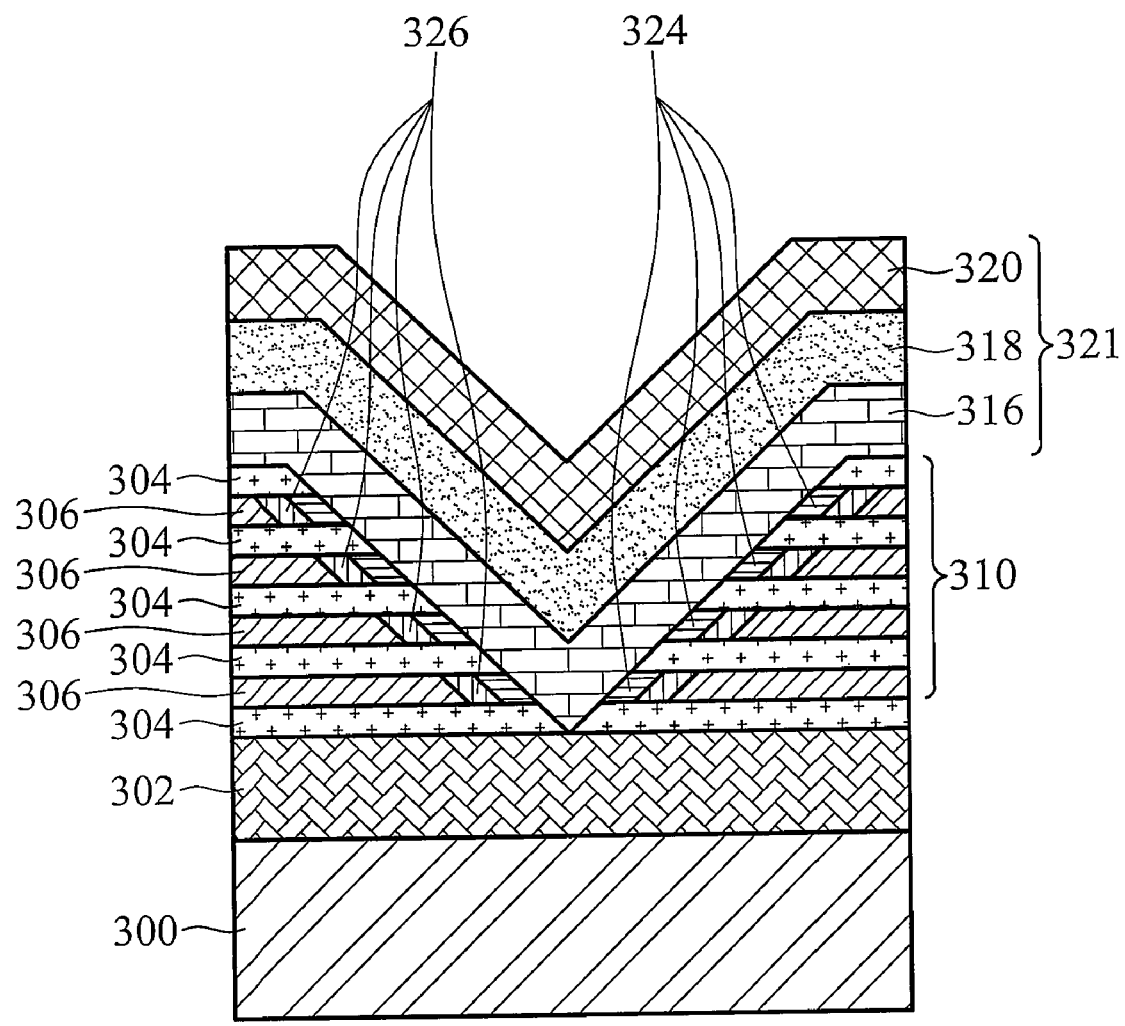
Figure 7C:
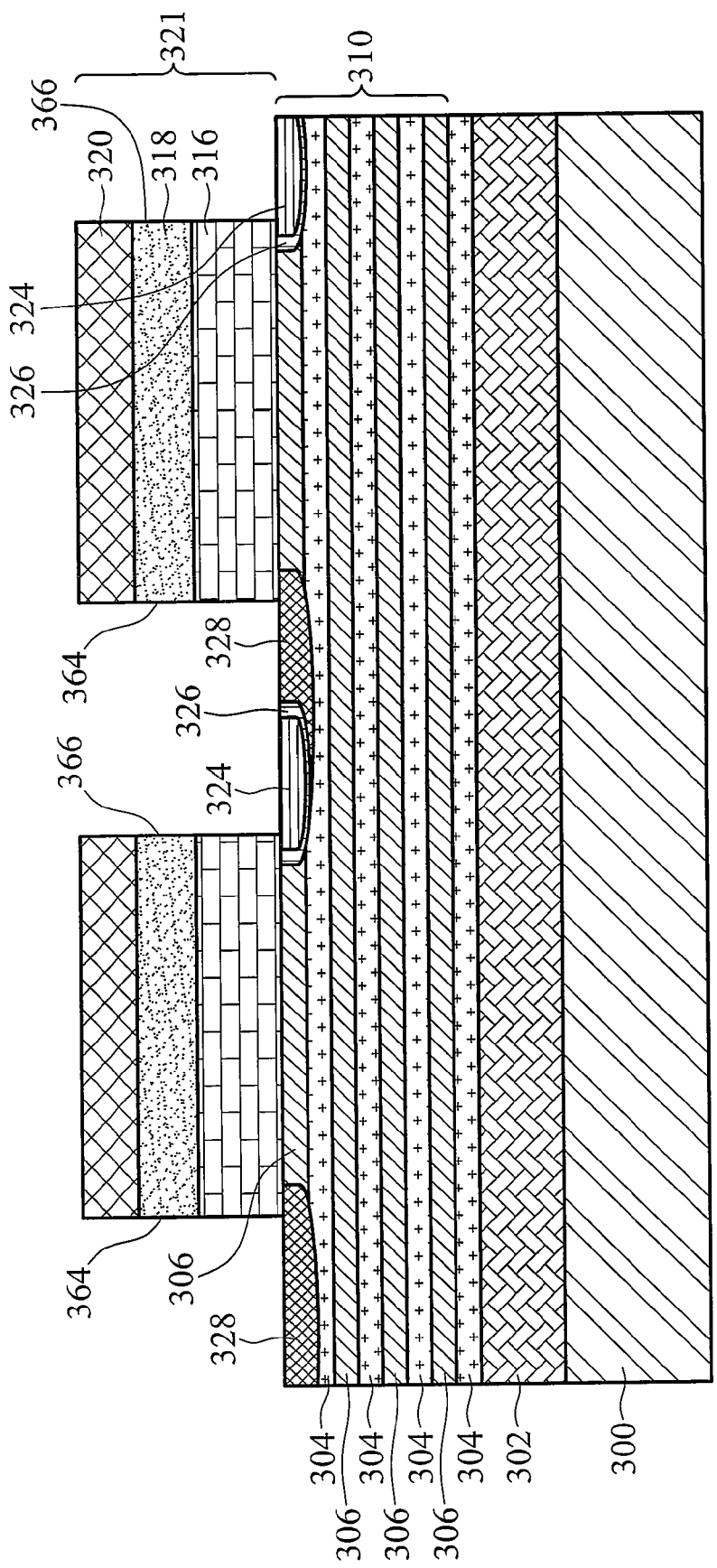
FIGS. 7c, 8b, 9b, 10c, 11b and 12b are cross sections taken along line B-B' of FIGS. 7a, 8a, 9a, 10a, 11a and 12a, respectively.

FIGS. 6a and 6b depict formation of a patterned photoresist 322. The patterned photoresist 322 covers half of the first semi-electrode structure 321, and a portion of the stacked structure 310. The other half of the first semi-electrode structure 321 and another part of the stacked structure 310 are exposed. Next, referring to FIGS. 7a, 7b and 7c, an impurity doping process comprising a first and a second doping step using the patterned photoresist 322 and the silicon nitride layer 320 as masks proceeds. In the first doping step, a doped region 326 is formed in the conductive layer 306 by doping with n-type impurities such as phosphorous (P) or arsenic (As). In the second doping step, a doped region 324 is formed in the conductive layer 306, by doping with p-type impurities such as boron (B) or difluoroborane (BF$_2$). The p-type doped region 324 (Rp=100 nm) has a shallower doping depth than the n-type doped region 326 (Rp=200 nm) by properly controlling process conditions such as doping energy of the first and the second doping steps to change the projected range (Rp) of the impurities. A shallower p-n junction is formed between the p-type doped region 324 and the n-type doped region 326 in the conductive layer 306, and a deeper p-n junction is formed between the n-type doped region 326 and the p-type conductive layer 306. A PNP bipolar junction transistor (PNP BJT) is then formed adjacent to a surface of the conductive layer 306 and the second sidewall 366 of the first semi-electrode structure 321. The patterned photoresist 322 is then removed, and a blanket implanting process to dope n-type impurities such as phosphorous (P) in the conductive layer 306 to form a doped region 328 proceeds. The doped region 328 is adjacent to the first sidewall 364 and the second sidewall 366 of the first semi-electrode structure 321. The doped region 328 has a deeper doping depth than the doped region 324.

Figure 8A:
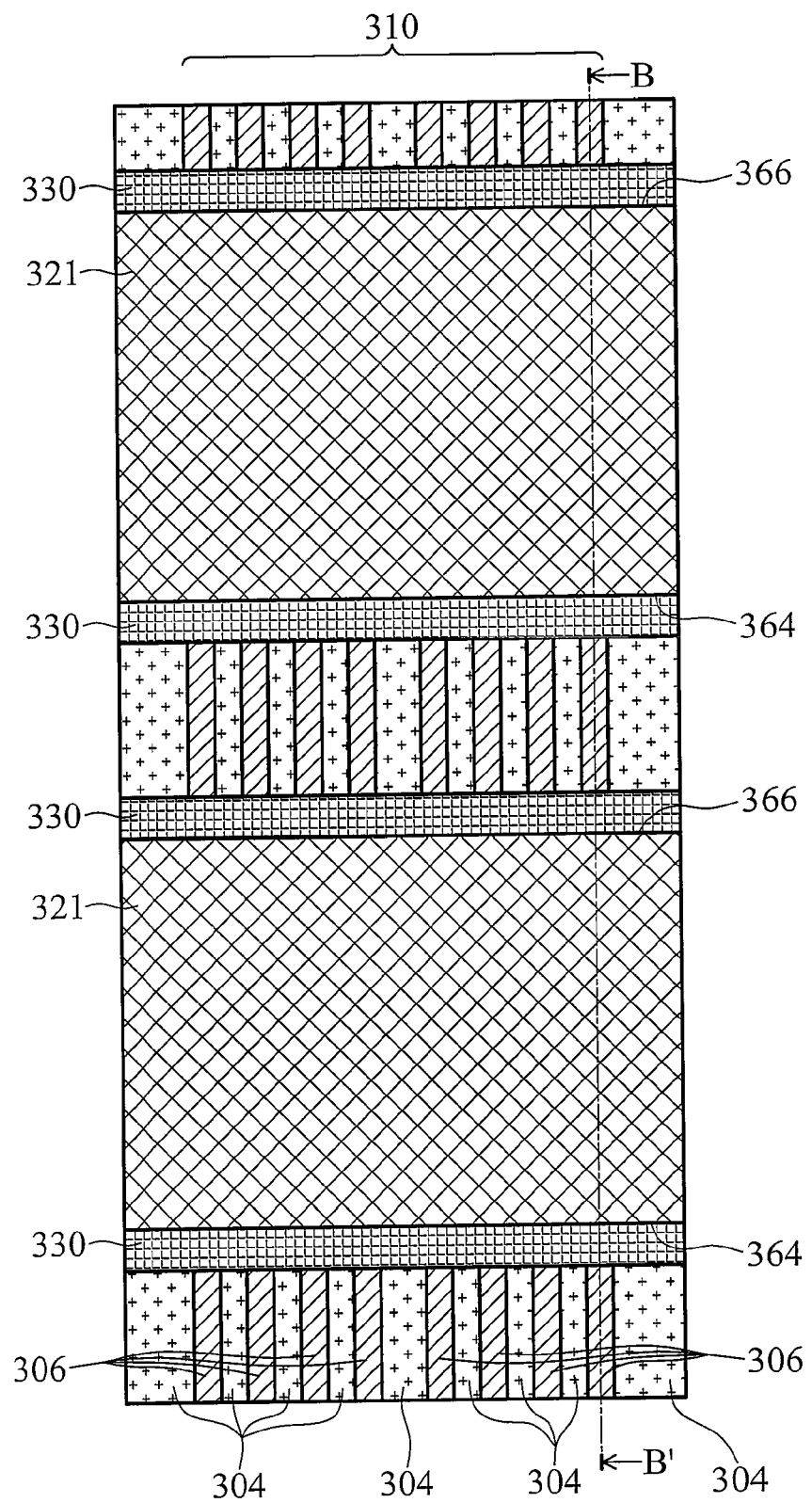
Figure 8B:
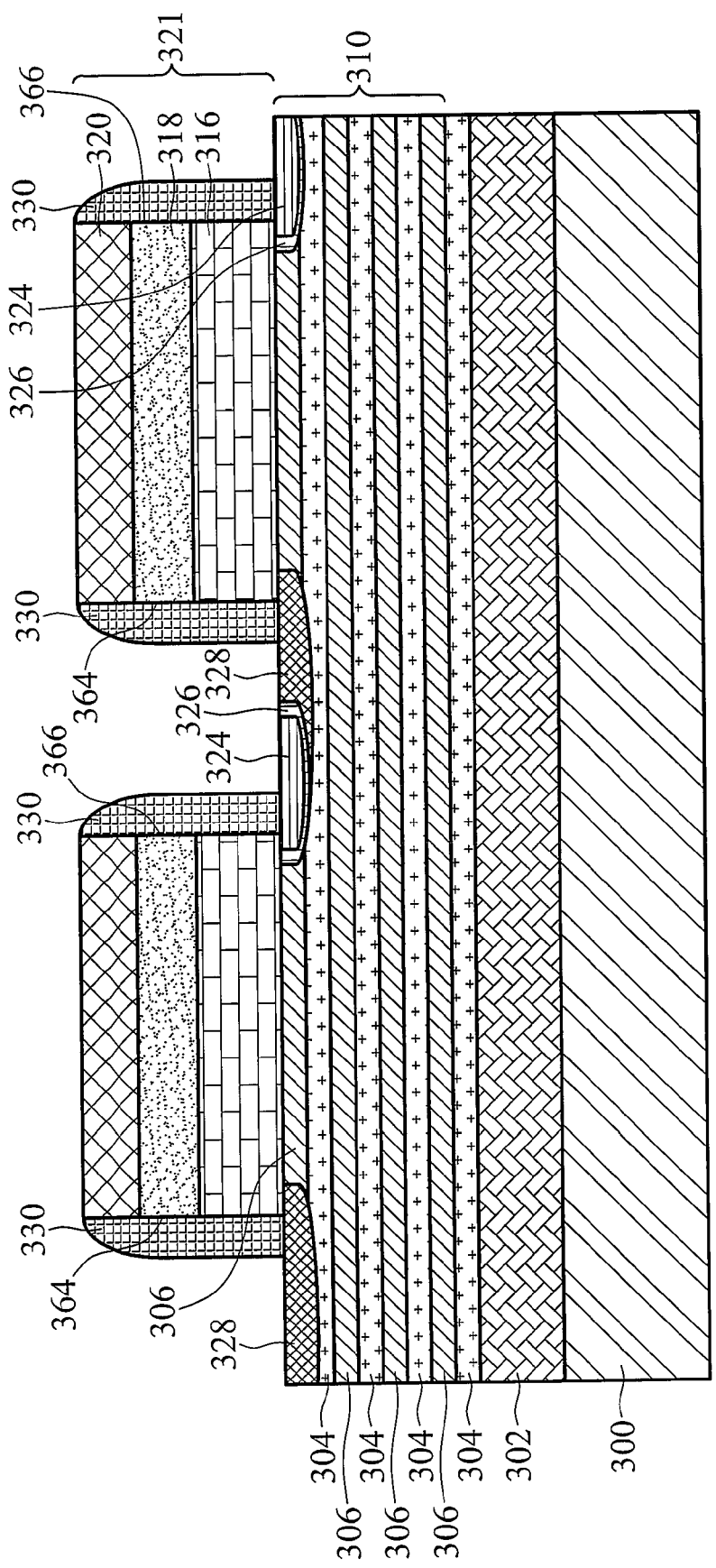

FIGS. 8a and 8b illustrate the formation of silicon nitride spacers 330. A silicon nitride layer is formed over the entire region with a thickness of about 30 nm to 50 nm, preferably of about 40 nm. The described 40 nm thickness is defined by an exemplary embodiment of a phase change memory device with a 20 nm×20 nm contact area, and the thickness may be adjusted according to various contact areas. A portion of the silicon nitride layer is then removed to form a plurality of silicon nitride spacers 330 on the first sidewall 364 and the second sidewall 366 of the first semi-electrode structure 321.

Figure 9A:
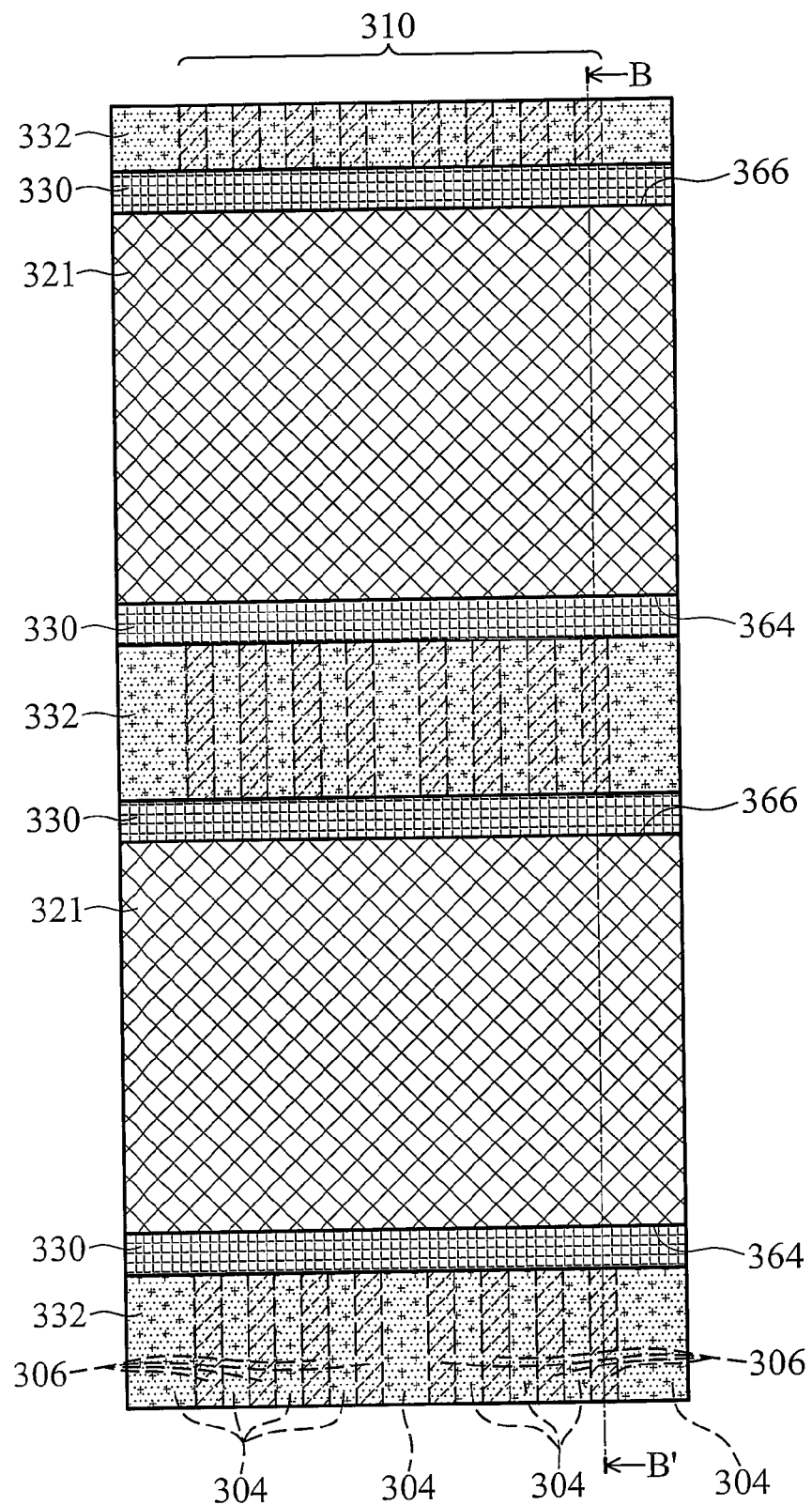
Figure 9B:
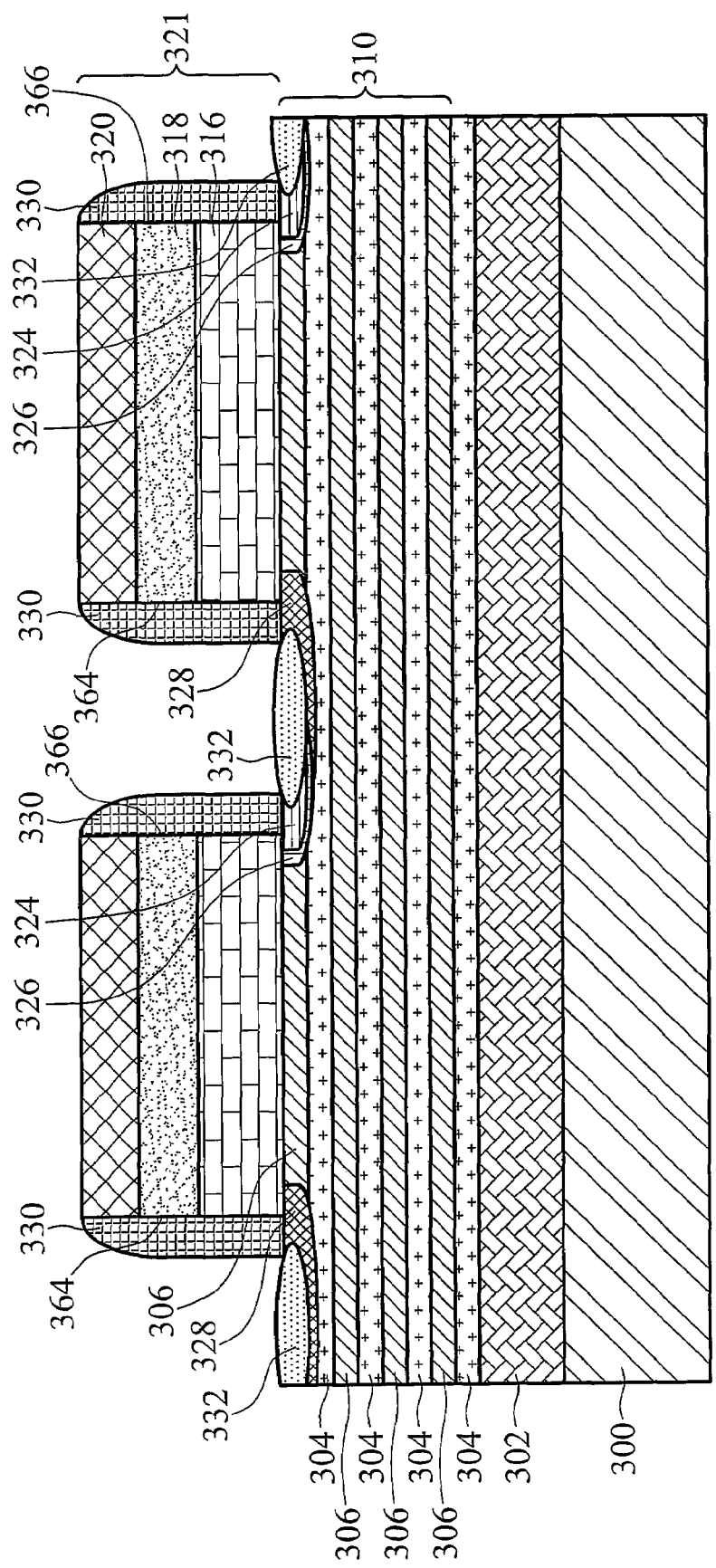

FIGS. 9a and 9b illustrate the formation of thermal oxides 332. The conductive layer 306 not covered by the first semi-electrode structure 321 and the silicon nitride spacers 330 is oxidized by an oxidation process using a furnace or a rapid thermal processor (RTP). An annealing process such as thermal annealing, flash annealing, laser annealing or the like then proceeds to form a plurality of the thermal oxides 332. The thermal oxides 332 are referred to as an electrical isolation between any two of the first electrode semi-structures 321 having a thickness of about 20 nm.

Figure 10A:
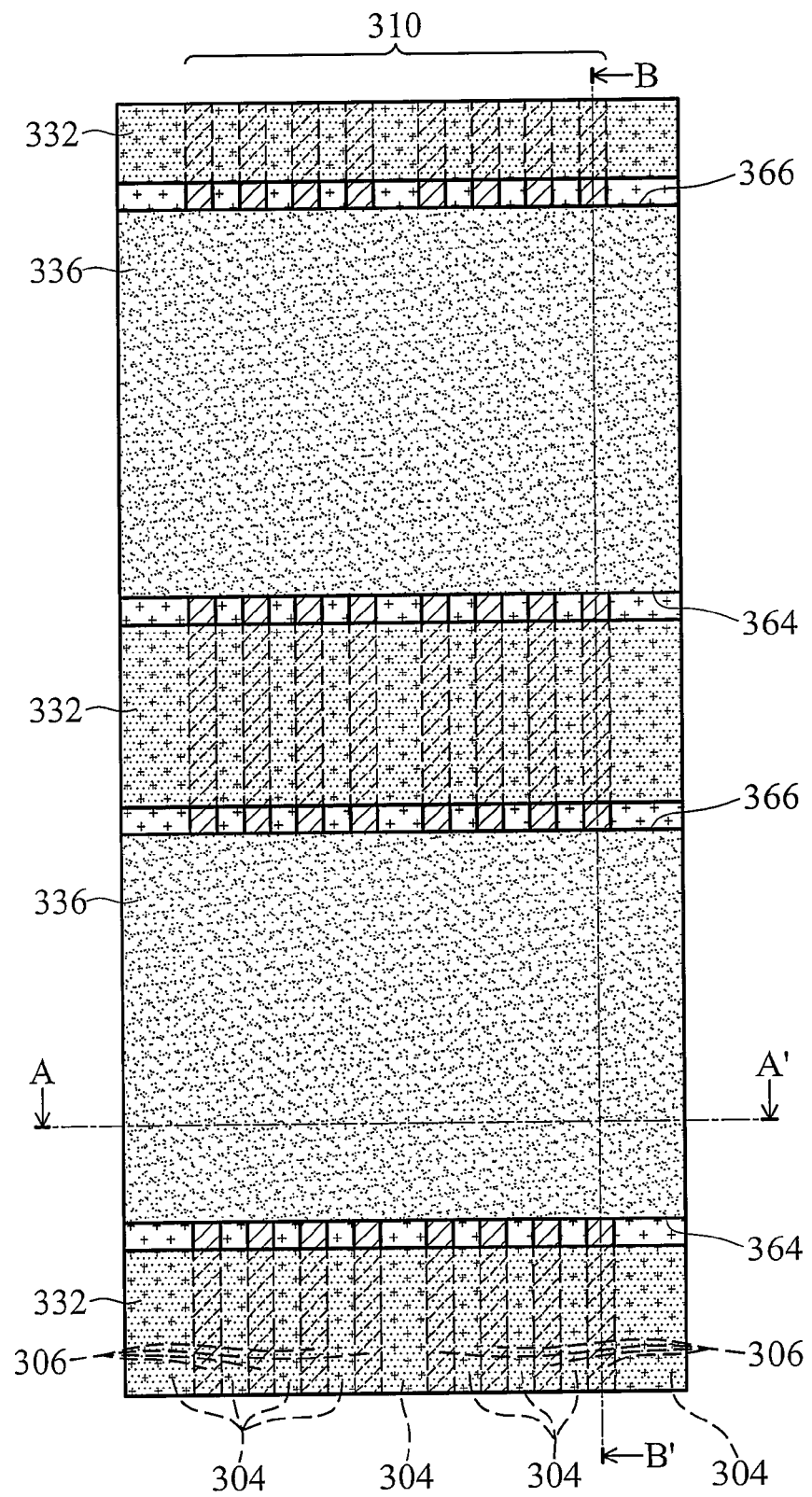
Figure 10:
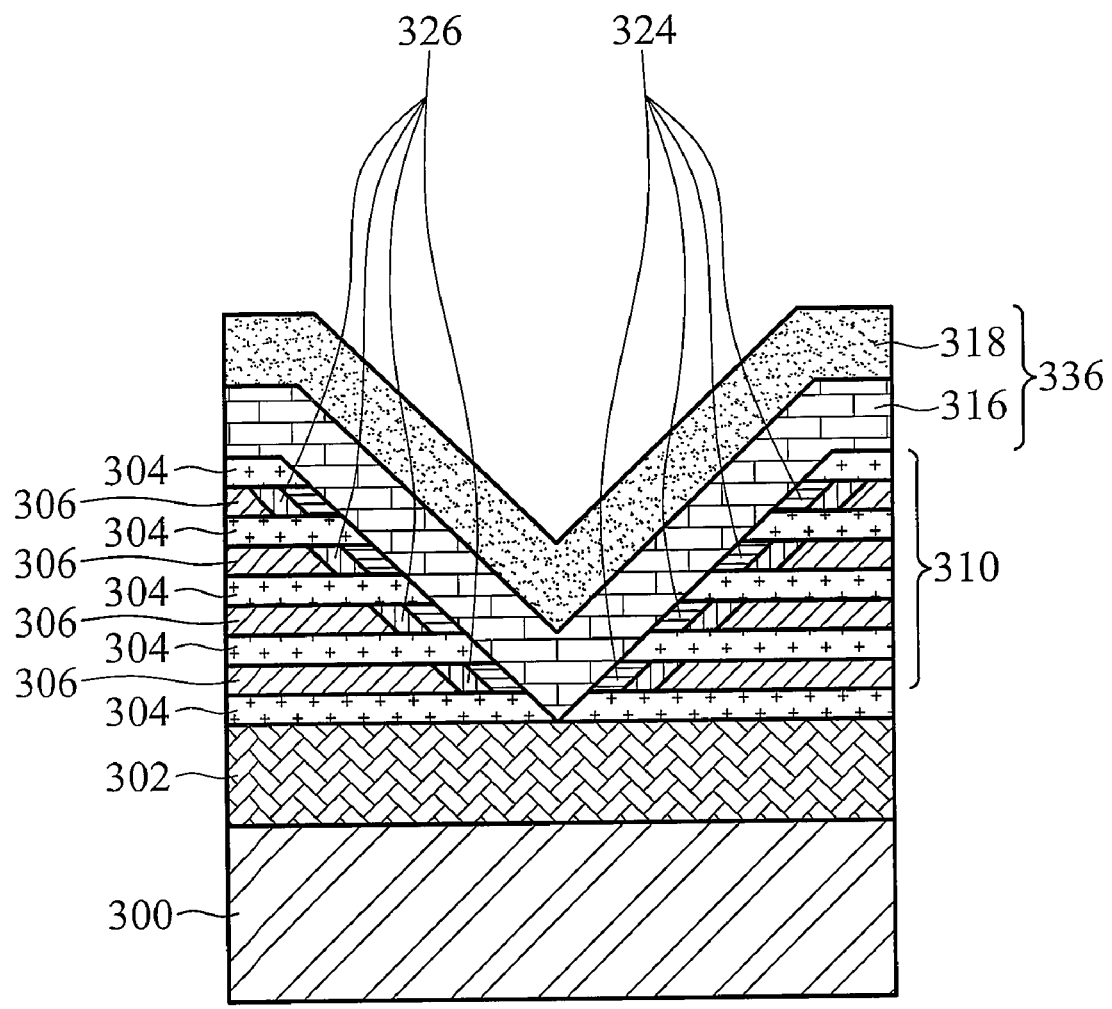
Figure 10C:
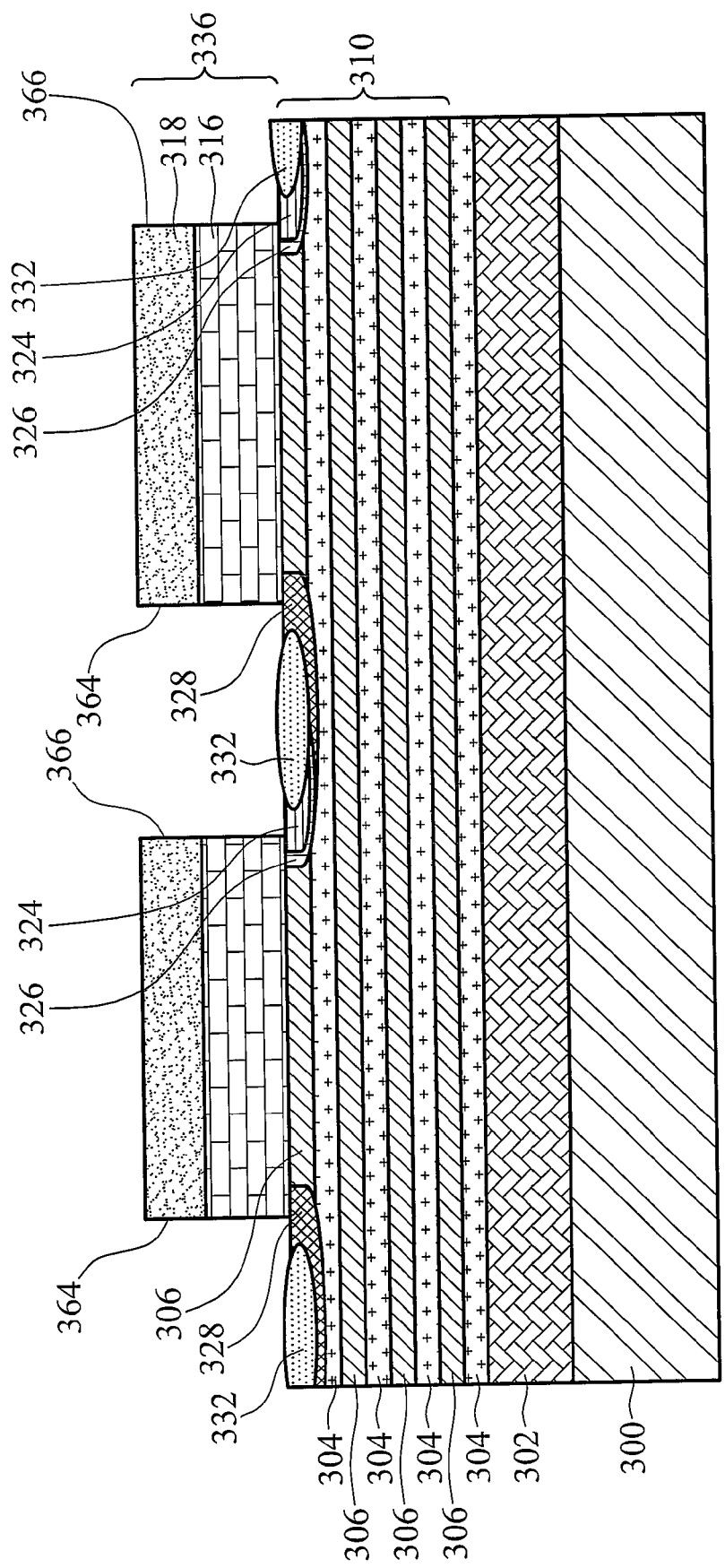

Next, referring to FIGS. 10a, 10b and 10c, the silicon nitride layer 320 and the silicon nitride spacers 330 are selectively removed to form a first electrode structure 336 by a dry or wet etching process. The first electrode structure 336 comprises the insulating layer 316 and the conductive layer 318, wherein the conductive layer 318 serves as a top electrode 318.

Figure 11A:
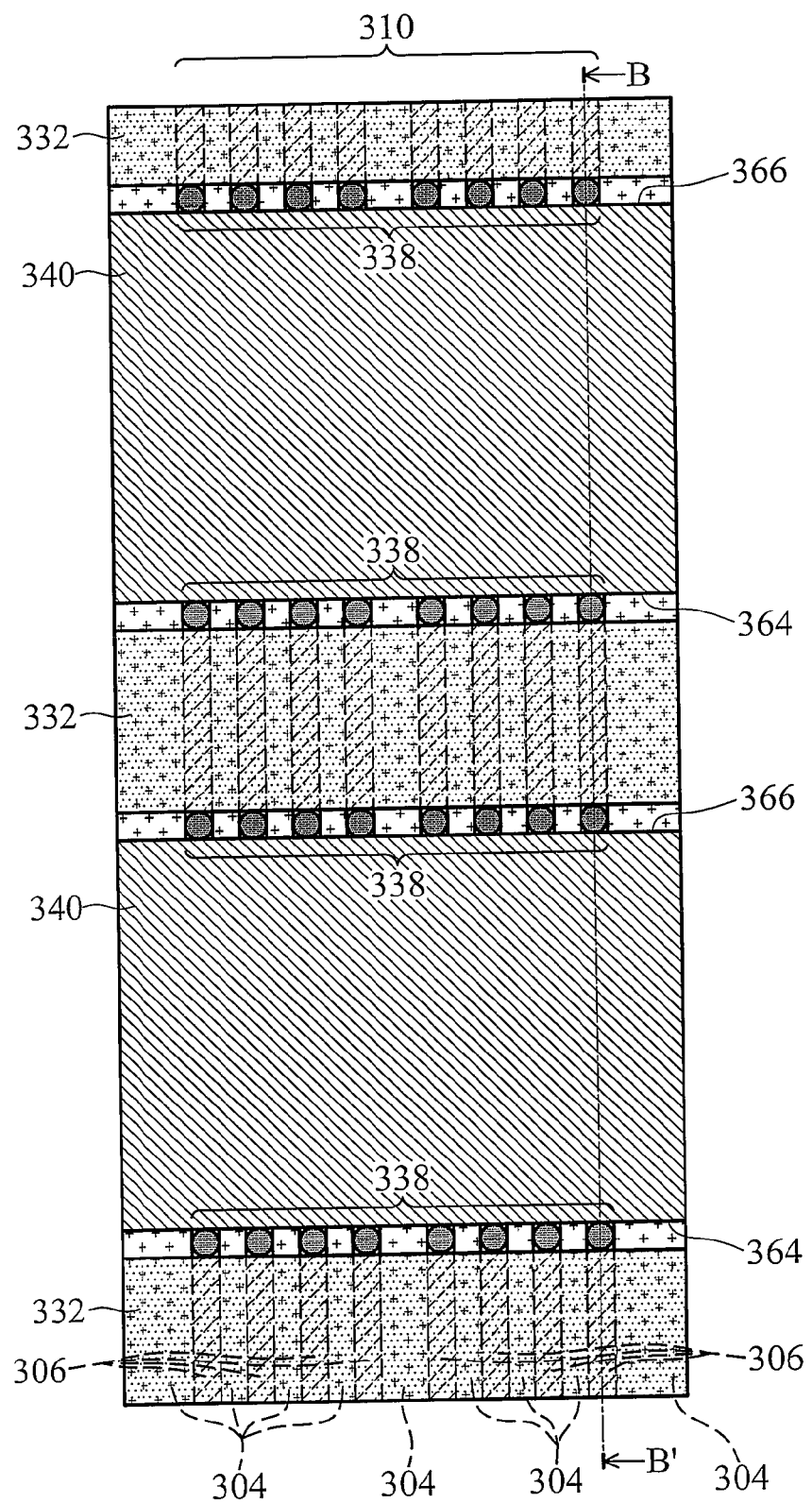
Figure 11B:
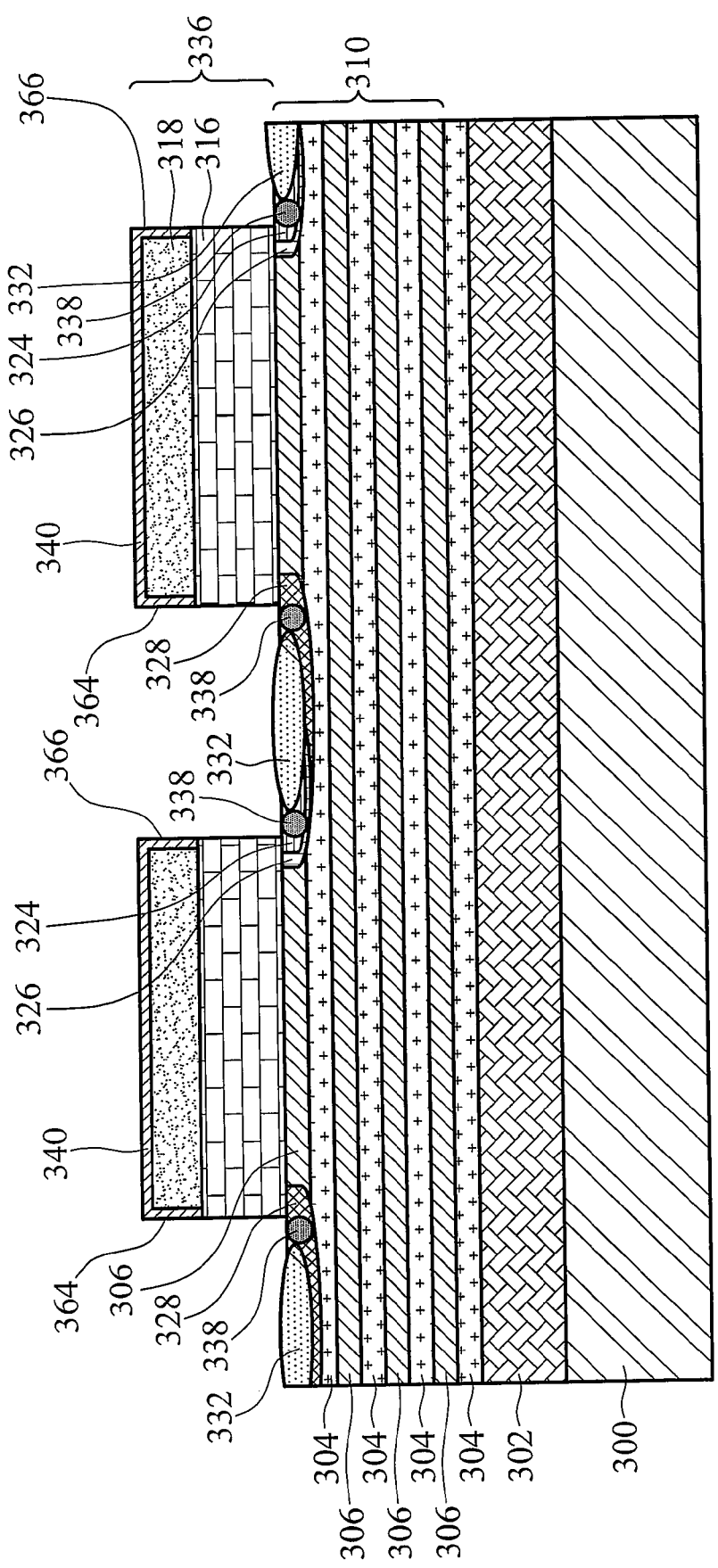

FIGS. 11a and 11b illustrate the formation of a heating electrode 338 a nitride metal silicide layer 340. The heating electrode 338 the nitride metal silicide layer 340 are formed by silicidation process. The silicidation process comprises blanketly depositing a thin metal layer (not shown) comprising cobalt (Co), tantalum (Ta), nickel (Ni), titanium (Ti), tungsten (W) or other refractory metals. In some embodiments, the thin metal layer may be formed by physical vapor deposition (PVD), sputtering, low pressure CVD (LPCVD), atomic layer CVD (ALD) or electroless plating. An annealing process then proceeds, and a portion of the thin metal layer is reacted with the conductive layer 306 and 318 to form metal silicides such as Co-salicide (CoSi$_x$), Ta-salicide (TaSi$_x$), Ni-salicide (NiSi$_x$), Ti-salicide (TiSi$_x$), W-salicide (WSi$_x$) or other refractory metal silicides. The annealing process may be performed using thermal annealing, flash annealing, laser annealing or other similar processes. The annealing process is preferably performed at a temperature of about 400° C. or higher. Next, the thin metal layer not reacted with the conductive layer 306 and 318 is removed by wet etching. Finally, an optional nitridation process is performed to nitrify the metal silicides on the conductive layer 306 and 318, respectively. After the nitridation process, the heating electrodes 338 are formed on the conductive layer 306, and the nitride metal silicide layers 340 are formed on the conductive layer 318. The heating electrodes 338 and the nitride metal silicide layers 340 may comprise $CoSi_xN_y$, $TaSi_xN_y$, $NiSi_xN_y$, $TiSi_xN_y$, $WSi_xN_y$ or other refractory nitride metal silicides, which have better thermal stability than metal silicides for preventing melting during a phase change process at high temperature. Nitride metal silicide is a more stable heating electrode for phase change materials. The heating electrodes 338 are disposed on adjoining first sidewall 364 and second sidewall 366 of the first electrode structure 336. The nitride metal silicide layers 340 and the heating electrodes 338 are separated by the insulating layer 316. Note that the dimensions of the heating electrode 338 define the thicknesses of the silicon nitride spacer 330 and thermal oxide 332. Additionally, a trim etching process, which is an optional, can be performed prior to formation of the heating electrode 338 the nitride metal silicide layer 340. A portion of each heating electrode 338 is removed by the trim etching process, thus, an edge of the nitride metal silicide layer 340 can be aligned to an edge of the insulating layer 316.

Figure 12A:
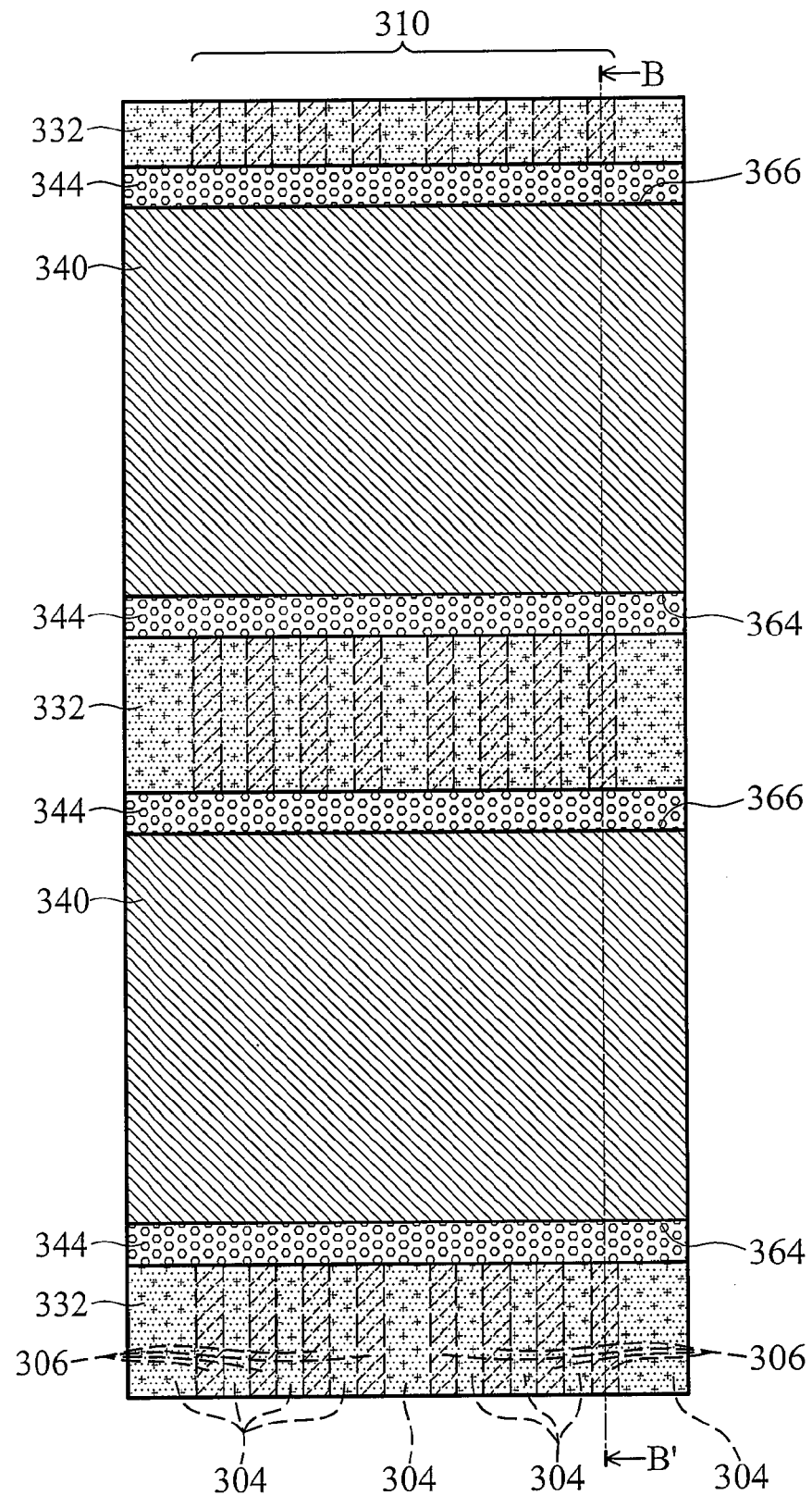
Figure 12B:
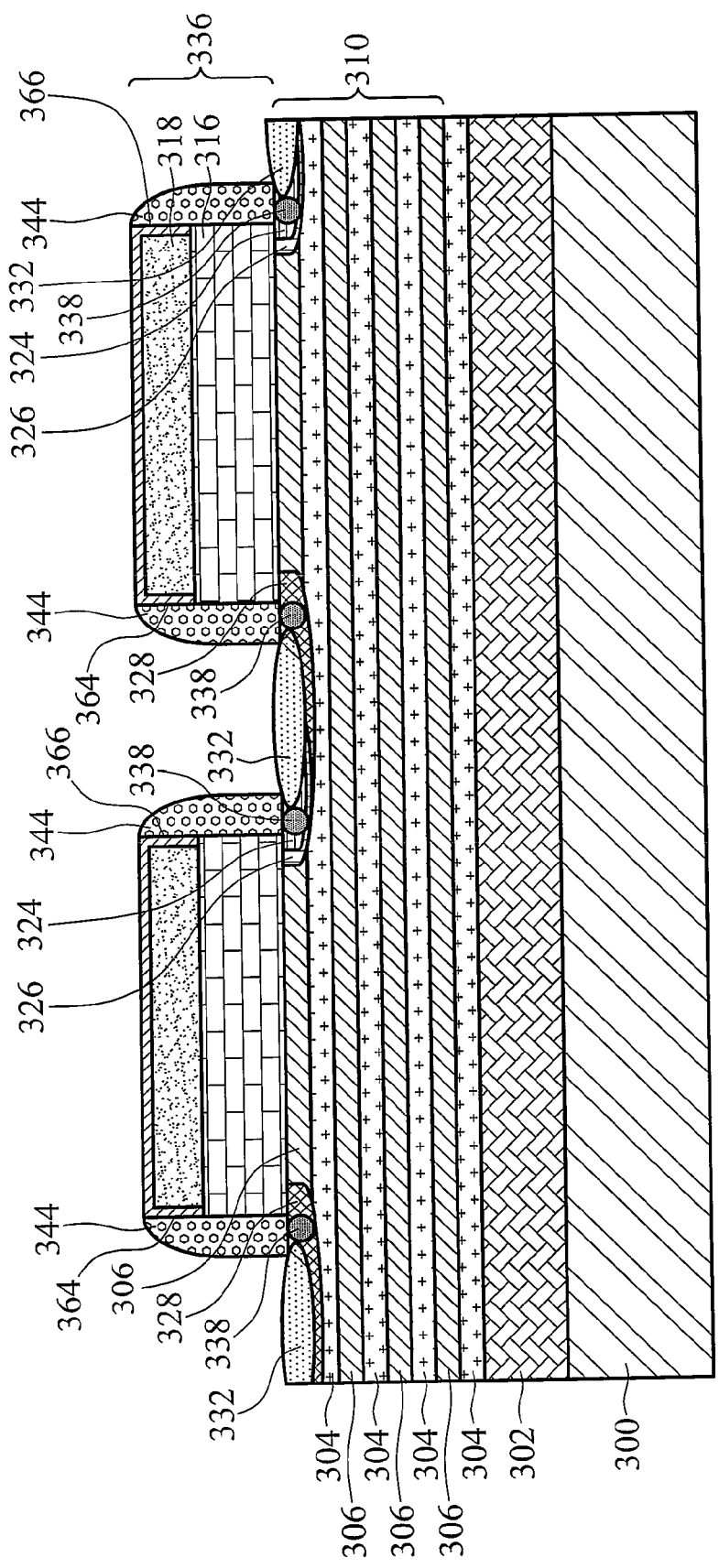

FIGS. 12a and 12b illustrate the formation of phase change material spacers 344. A phase change material film (PC film) is blankly deposited over the entire region by physical vapor deposition (PVD), thermal evaporation, pulsed laser deposition or metal organic chemical vapor deposition (MOCVD). The PC film may comprise binary, ternary or tetra chalcogenide such as GaSb, GeTe, Ge—Sb—Te (GST) alloy, Ag—In—Sb—Te alloy or combination thereof. An anisotropic etching is performed to form the phase change material spacers 344 on the first sidewall 364 and the second sidewall 366 of the first electrode structure 336. Thus, the formation of phase change memory device 100 is complete.

The phase change material spacer 344 is connected to the heating electrode 338 the nitride metal silicide layer 340. In some embodiments, each of the phase change material spacers 344 is connected to eight heating electrodes 338, wherein each of the heating electrodes 338 and the conductive layer (top electrode) 318 form a bit of a phase change material device. Thus each phase change memory device 100 has sixteen bits, and is a multi-bit phase change memory device 100. The number of conductive layers 306 of the stacked structure 310 defines the number of bits of the phase change memory device 100. The multi-bit requirement can be achieved by properly controlling the thickness and number of insulating layers 304 and conductive layers 306 of the stacked structure 310.

Figure 13:
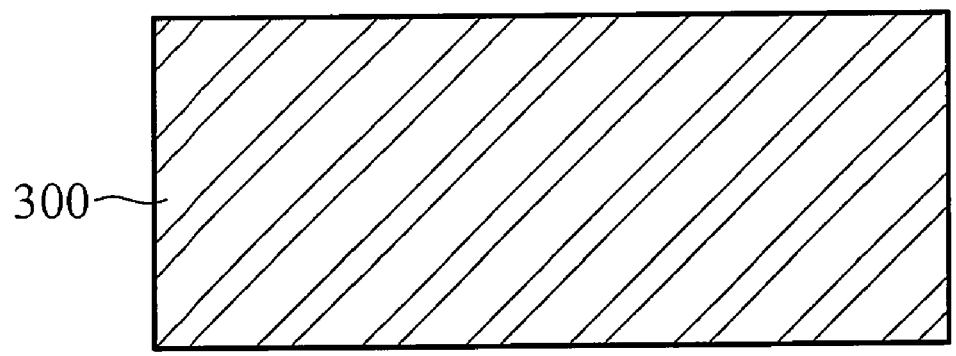
FIGS. 13 to 16 are cross sections showing another exemplary embodiment of a phase change memory device.
Figure 14:
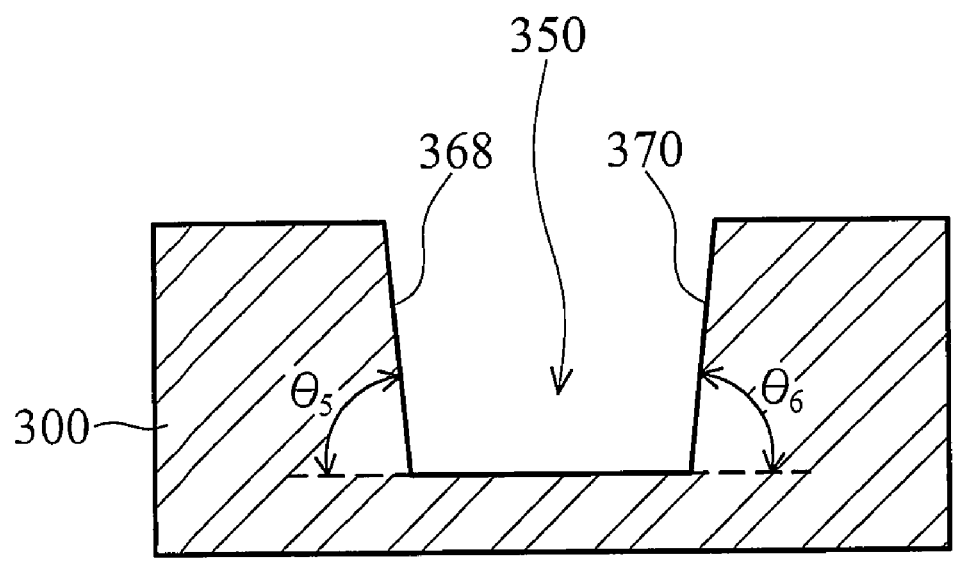
Figure 16:
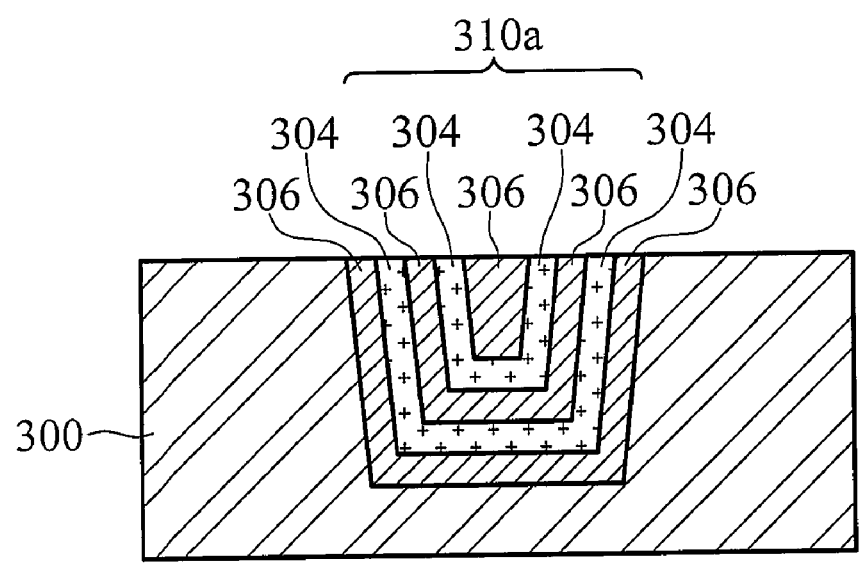

FIGS. 13 and 16 depict the formation of another exemplary embodiment of a stacked structure 310a. A substrate 300 is provided as shown in FIG. 13. Next, referring to FIG. 14, a second trench 350 is formed by etching the substrate 300 using a patterned photoresist (not shown) as a mask. The second trench 350 has a fifth sidewall 368 and a sixth sidewall 370 with an angle $\theta_5$ of 15° to 75° between the fifth sidewall 368 and the substrate 300 and an angle $\theta_6$ of 15° to 75° between the sixth sidewall 370 and the substrate 300. In one embodiment, the angles $\theta_5$ and $\theta_6$ are about 0° to 90°, preferably about 30° to 60°, more preferably about 40° to 50°. The angles $\theta_3$ and $\theta_4$ may be the same or different. The second trench 350 may be formed by the same way of forming the first trench 314.

Figure 15:
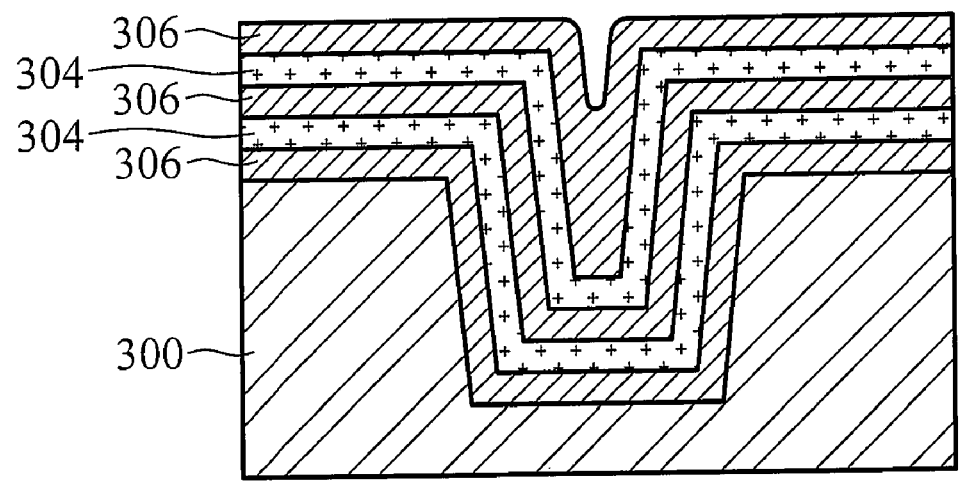

Referring to FIG. 15, a plurality of the insulating layers 304 and conductive layers 306 are conformally and alternatively formed in the second trench 350 by CVD or other known deposition processes. In one embodiment, the number of insulating layers 304 and conductive layers 306 is respectively more than one, preferably more than two, and more preferably more than four. Any two of the adjacent conductive layers 306 are spaced apart by one of the insulating layers 304. The insulating layers 304 may comprise silicon dioxide ($SiO_2$), and the conductive layers 306 may comprise polysilicon, and preferably comprise p-type impurity doped polysilicon. The p-type impurities may comprise boron (B) or difluoroborane ($BF_2$). In another embodiment, the conductive layers 306 may comprise amorphous silicon.

Next, referring to FIG. 16, a planarization process proceeds to form a stacked structure 310a. A chemical mechanical polishing (CMP) process may be used to remove excess insulating layer 304 and conductive layer 306 for surface planarization, thus, the stacked structure 310a is formed. Other processes may be used for the planarization process such as an etching back process. The insulating layers 304 and the conductive layers 306 of the stacked structure 310a are stacked vertically in the second trench 350, and the stacked structure 310a is substantially coplanar to the substrate 300. The same formation processes as shown in FIGS. 5a and 5b to 12a and 12b can be referred to in the previous description and are not repeated for brevity.

In another exemplary embodiment of a stacked structure 310a, the surface is substantially a flat surface. Thus, the size of subsequently formed heating electrodes 338 is controlled by the thickness of the conductive layer 306. The number of conductive layers 306 of the stacked structure 310a defines the number of bit of memory device 100.

The invention provides a phase change memory device. An exemplary embodiment of a phase change memory device 100 comprises a substrate 300 comprising a stacked structure 310. The stacked structure 310 comprises a plurality of insulating layers 304 and conductive layers 306. Any two of the conductive layers 306 are spaced apart by one of the conductive layers 304. A first electrode structure 336 with a first sidewall 364 and a second sidewall 366 is formed on the stacked structure 310. A plurality of heating electrodes 338 are placed on the conductive layers 306 and adjacent to the first sidewall 364 and the second sidewall 366 of the first electrode structure 310. A pair of phase change material spacers 344 is placed on the first sidewall 364 and the second sidewall 366 of the first electrode structure 310. The phase change material sidewalls 344 cover the plurality of heating electrodes 338.

Figure 17:
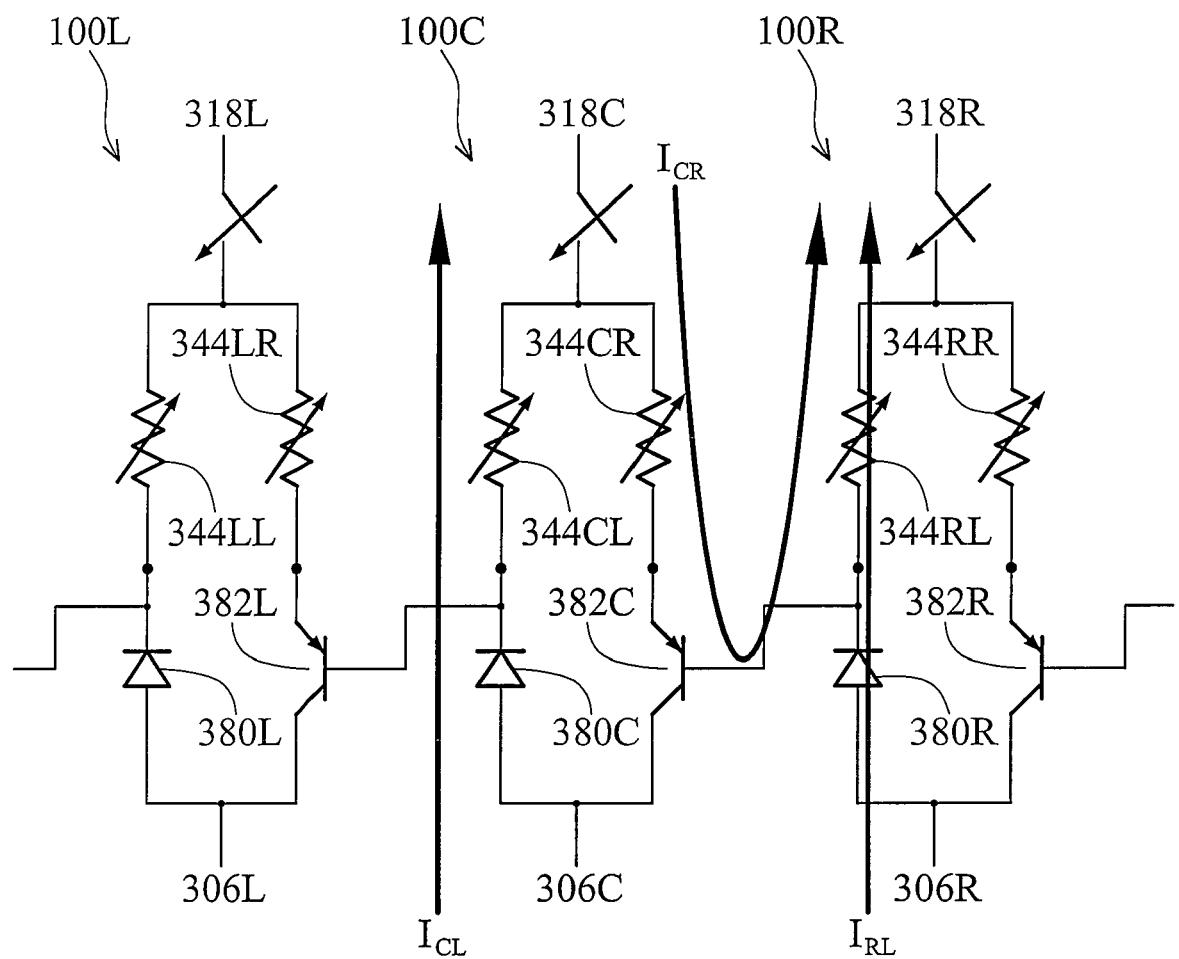
FIG. 17 is a circuit diagram showing an exemplary embodiment of a phase change memory device array.

FIG. 17 is a circuit diagram showing an exemplary embodiment of a phase change memory device array. The phase change memory device array as shown in FIG. 17 comprises three serially connected phase change memory devices 100L, 100C and 100R. Each phase change memory device 100L, 100C and 100R comprises phase change material spacer 344LL, 344LR, 344CL, 344CR, 344RL and 344RR, p-n junction 380L, 380C and 380R (formed by the p-type conductive layer 306 and n-type doped region 328 as shown FIG. 12b), and PNP BJT 382L, 382C and 382R (formed by the p-type conductive layer 306, n-type doped region 328, n-type doped region 326 and p-type doped region 324 as shown FIG. 12b). A first writing step for writing the phase change material spacer 344CL and 344CR of the phase change memory device 100C may proceed. 0V is applied to the conductive layer 306C while −2V to −6V is applied to conductive layer 308C. At the same time 0V of voltage is applied to the conductive layer 306L and 306R, the top electrode 318L and 318R of the non-selected phase change memory device 100L and 100R. A forward bias is applied to the p-n junction 380C and the PNP BJT 382C, and a current $I_{CL}$ is flowed through the phase change material spacer 344CL. Thus, the phase of the phase change material spacer 344CL is changed. Next, a second writing step proceeds. 0V is applied to the top electrode 318C while −2V to −6V is applied to the top electrode 318R. At the same time, 0V is applied to the non-selected conductive layer 306L, 306C, 306R and the top electrode 318L. A forward bias is applied to the PNP BJT 382C, and a current $I_{CR}$ is flowed through the phase change material spacer 344CL and 344RL. Thus the phase of the phase change material spacer 344CL and 344RL are changed. A rewriting step then proceeds. 0V is applied to the conductive layer 306R while −2V to −6V is applied to the conductive layer 308R. At the same time, 0V is applied to the conductive layers 306L and 306C, the top electrodes 318L and 318C of the non-selected phase change memory device 100L and 100R. A forward bias is formed on the p-n junction 380R, and a current $I_{RL}$ is flowed through the phase change material spacer 344RL. Thus the phase of the phase change material spacer 344RL returns to the original phase.

Some advantages of an exemplary embodiment of the phase change memory device 100 are described in the following. The real contact area of the phase change material spacer 344 and the heating electrode 338 is controlled by the size of the heating electrode 338. The thickness of the silicon nitride spacer 330 and the subsequent nitride silicide process controls the size of the heating electrode 338. Thus, the size of the heating electrode is smaller and more precisely controlled than the conventional heating electrode formed by photolithography. The process of fabricating the phase change memory device 100 of the invention is better able to form a relatively smaller contact area than the process disclosed in EP. Pat. No. 1339111 issued by ST Microelectronics Corporation (STM). The contact hole structure of the phase change memory device 100 has a V-shaped 3-dimensional (3D) structure. From the top view (FIG. 12a) it can be seen that an exemplary embodiment of the phase change memory device 100 may be formed using photolithography with a relatively lower critical dimension (CD) resolution (above 0.11 μm) for higher CD resolution photolithography requirements (such as ArF photolithography with 32 to 65 nm CD resolution). This can be achieved by reducing the thickness of the conductive layer 304 of the stacked structure 310 to 20 nm. Only three masks are required for the formation of the phase change memory device 100, thus, substantial cost reductions can be achieved. Also, only twenty-four process steps are required to form the phase change memory device 100, far less than the conventional process. The contact area of an exemplary embodiment of the phase change memory device 100 is defined by the heating electrode 338. After forming the phase change material spacer 344, the formation of not only the contact with electrode 338 and top electrode 318, but also the phase change memory device 100 is complete. The conventional current direction problem due to misalignment between the phase change material and the top electrode formed by the conventional process. Additionally, the thickness of the phase change material spacer 344 is not the main factor of in contact area definition, thus, controlling the thickness is not required. The phase change memory device 100 of the invention is not hindered by size problem of the conventional cup-shaped bottom electrode disclosed in EP. Pat. No. 1339111 issued by STM Corp. A large portion of the conventional cup-shaped bottom electrode is not used for a contact hole and thus suffers from NVM area bit density. The definition of the contact area between the phase change material spacer 344 and the heating electrode 338 of the phase change memory device 100 does not suffer from the seam problem of the conventional minitrench filling process disclosed in EP. Pat. No. 1339111 issued by STM Corporation. The phase change material spacer 344 is filled in a trench with a dimension of about 0.11 μm or above for a 20 nm×20 nm contact area of an embodiment of a phase change material device 100, and is calculated by a 40 nm silicon nitride layer 340, a 30 nm phase change material spacer 344 and a 30 nm insulating layer 304, and may be preformed by common deposition machines, for example, Endura IMP PVD for 8" wafer provided by AMAT Corporation. A most important advantage of the phase change memory device 100 is that the metal-based polymer residual formed on an edge of the phase change material spacer 344 after forming the phase change material spacer 344 does not contact the heating electrode 338, thus, the heating electrode 338 is not attacked by the etching gas utilized for forming the phase change material spacer 344. Thus, no device ability or product life issues arise during operation of the phase change memory device. A polysilicon forming process with a relatively higher temperature (600° C. to 650° C.) can be utilized for forming the p-n junction of the phase change memory device 100. In the conventional process (INTEL 3D-PCM process), the p-n junction is formed after deposition of the phase change material. As is well known in the art, the phase change material will decompose at a temperature higher than 400° C. Thus, the conventional process can not employed. A phase change material device is, however, required for high current density and low current. Amorphous silicon is worse for forming p-n junctions due to having lower current density endurance than polysilicon. The phase change material spacer 344 is formed subsequent to all high temperature processes, thus, device stability can be improved, and the p-n junction of the phase change memory device 100 is completely formed in one step, and the process is simpler.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase change memory device, comprising:
   a substrate comprising a stacked structure, the stacked structure comprises a plurality of insulating layers and conductive layers, wherein any two of the adjacent conductive layers of the stacked structure are spaced apart by one of the insulating layers;
   a first electrode structure with a first sidewall and a second sidewall formed on the stacked structure;
   a plurality of heating electrodes placed on the conductive layers and adjoining the first sidewall and the second sidewall of the first electrode structure;
   a pair of phase change material spacers placed on the first sidewall and the second sidewall of the first electrode structure covering the plurality of heating electrodes.

2. The phase change memory device as claimed in claim 1, wherein the insulating layers and conductive layers of the stacked structure are horizontally stacked.

3. The phase change memory device as claimed in claim 2, further comprising:
   a first trench formed in the stacked structure to expose the insulating layers and conductive layers of the stacked structure.

4. The phase change memory device as claimed in claim 3, wherein the first trench has a third sidewall and a fourth sidewall with an angle $\theta_3$ of 15° to 75° between the third sidewall and the substrate and an angle $\theta_4$ of 15° to 75° between the fourth sidewall and the substrate.

5. The phase change memory device as claimed in claim 4, wherein the angle $\theta_3$ is equal to the angle $\theta_4$.

6. The phase change memory device as claimed in claim 4, wherein the angle $\theta_3$ is different from the angle $\theta_4$.

7. The phase change memory device as claimed in claim 1, wherein the substrate further comprises a second trench, the insulating layers and conductive layers of the stacked structure are stacked vertically in the second trench, and the stacked structure is substantially coplanar to the substrate.

8. The phase change memory device as claimed in claim 7, wherein the second trench has a fifth sidewall and a sixth sidewall with an angle $\theta_5$ of 15° to 75° between the fifth sidewall and the substrate and an angle $\theta_6$ of 15° to 75° between the sixth sidewall and the substrate.

9. The phase change memory device as claimed in claim 8, wherein the angle $\theta_5$ is equal to the angle $\theta_6$.

10. The phase change memory device as claimed in claim 8, wherein the angle $\theta_5$ is different from the angle $\theta_6$.

11. The phase change memory device as claimed in claim 1, wherein the conductive layer is a p-type doped polysilicon layer.

12. The phase change memory device as claimed in claim 1, wherein the first electrode structure is a composite layer comprising an oxide layer, a polysilicon layer and a metal silicide layer.

13. The phase change memory device as claimed in claim 12, wherein the metal silicide layer comprises nitrided metal silicide.

14. The phase change memory device as claimed in claim 12, wherein the polysilicon layer is a p-type or n-type doped polysilicon layer.

15. The phase change memory device as claimed in claim 12, wherein the polysilicon layer is separated form the heating electrode by the oxide layer.

16. The phase change memory device as claimed in claim 1, wherein the heating electrode comprises metal silicide, nitrided metal silicide or combination thereof.

17. The phase change memory device as claimed in claim 1, further comprising:
 a bipolar junction transistor formed in the conductive layer by doping impurities, the bipolar junction transistor is adjacent to a surface of the conductive layer and the second sidewall of the first electrode structure.

* * * * *